(12) United States Patent
Kim et al.

(10) Patent No.: US 12,046,697 B2
(45) Date of Patent: Jul. 23, 2024

(54) BACKLIGHT UNIT INCLUDING GREEN AND BLUE LEDS AND ASSOCIATED DISTRIBUTED BRAGG REFLECTORS

(71) Applicant: SAMSUNG ELECTRONICS CO., LTD., Suwon-si (KR)

(72) Inventors: Sungyeol Kim, Suwon-si (KR); Hyungsuk Kim, Suwon-si (KR); Chunsoon Park, Suwon-si (KR); Hyukjun Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/968,500

(22) Filed: Oct. 18, 2022

(65) Prior Publication Data

US 2023/0118897 A1  Apr. 20, 2023

Related U.S. Application Data

(63) Continuation of application No. PCT/KR2022/014668, filed on Sep. 29, 2022.

(30) Foreign Application Priority Data

Oct. 18, 2021 (KR) .......................... 10-2021-0138309

(51) Int. Cl.
*H01L 33/10* (2010.01)
*C01B 33/12* (2006.01)
(Continued)

(52) U.S. Cl.
CPC .............. *H01L 33/10* (2013.01); *C01B 33/12* (2013.01); *C01G 23/047* (2013.01);
(Continued)

(58) Field of Classification Search
CPC ....... H01L 33/10; C01B 33/12; C01G 23/047; G02F 1/133603; G02F 1/133605
See application file for complete search history.

(56) References Cited

U.S. PATENT DOCUMENTS 6,940,099 B2  9/2005  Hata et al.
8,609,448 B2  12/2013  Chen et al.
(Continued)

FOREIGN PATENT DOCUMENTS

CN  108987609 B  *  5/2020  .......... H01L 51/5271
JP  2017-157278 A     9/2017
(Continued)

OTHER PUBLICATIONS

Yamamoto et al., JP2017157278, Machine Translation Sep. 2017 (Year: 2017).*

(Continued)

*Primary Examiner* — Tracie Y Green
(74) *Attorney, Agent, or Firm* — Sughrue Mion, PLLC

(57) ABSTRACT

A display apparatus includes a liquid crystal panel; and a backlight unit configured to provide light to the liquid crystal panel, wherein the backlight unit includes: a substrate; and a plurality of light emitting diode groups provided on an upper surface of the substrate, wherein each of the plurality of light emitting diode groups includes a red light emitting diode, a green light emitting diode, and a blue light emitting diode, wherein each of the red light emitting diode, the green light emitting diode, and the blue light emitting diode includes: a light emitting layer; and a distributed Bragg reflector (DBR) provided on the light emitting layer, and wherein reflectivities of the distributed Bragg reflectors of the red light emitting diode, the green light emitting diode, and the blue light emitting diode are within (Continued)

a same range of reflectivity according to an incident angle of light incident on the distributed Bragg reflectors.

15 Claims, 15 Drawing Sheets

(51) Int. Cl.
    *C01G 23/047*     (2006.01)
    *G02F 1/13357*     (2006.01)
    *H01L 25/075*     (2006.01)

(52) U.S. Cl.
    CPC .. *G02F 1/133603* (2013.01); *G02F 1/133605* (2013.01); *G02F 1/133617* (2013.01); *H01L 25/0753* (2013.01); *G02F 2201/346* (2013.01); *G02F 2201/52* (2013.01)

(56) References Cited

U.S. PATENT DOCUMENTS

| | | | |
|---|---|---|---|
| 9,876,149 | B2 | 1/2018 | Bang et al. |
| 10,401,557 | B2 | 9/2019 | Kim et al. |
| 10,948,163 | B2 | 3/2021 | Lee |
| 2015/0144981 | A1* | 5/2015 | Suh .......... H01L 33/50 257/98 |
| 2016/0349445 | A1* | 12/2016 | Kim .......... H01L 33/56 |
| 2017/0148845 | A1* | 5/2017 | Lee .......... H01L 33/60 |
| 2020/0350295 | A1 | 11/2020 | Hu et al. |

FOREIGN PATENT DOCUMENTS

| | | |
|---|---|---|
| KR | 10-2016-0088207 A | 7/2016 |
| KR | 10-2016-0141302 A | 12/2016 |
| KR | 10-2019-0090332 A | 8/2019 |

OTHER PUBLICATIONS

Choi et al., KR20160088207A, Machine Translation Jul. 2016 (Year: 2016).*

International Search Report (PCT/ISA/210) issued by the International Searching Authority on Jan. 31, 2023 in International Patent Application No. PCT/KR2022/014668.

Written Opinion (PCT/ISA/237) issued by the International Searching Authority on Jan. 31, 2023 in International Patent Application No. PCT/KR2022/014668.

* cited by examiner

BACKLIGHT UNIT INCLUDING GREEN AND BLUE LEDS AND ASSOCIATED DISTRIBUTED BRAGG REFLECTORS

CROSS-REFERENCE TO RELATED APPLICATIONS

This application is a continuation application of International Application No. PCT/KR2022/014668, filed on Sep. 29, 2022, which is based on and claims priority to Korean Patent Application No. 10-2021-0138309, filed on Oct. 18, 2021, in the Korean Intellectual Property Office, the disclosure of which is incorporated by reference herein in its entity.

BACKGROUND

1. Field

The disclosure relates to a display apparatus including a liquid crystal panel and a backlight unit (BLU).

2. Description of Related Art

In general, a display apparatus converts acquired or stored electrical information into visual information to display the visual information for users. Display apparatuses are widely used in various fields, such as home or places of business.

Examples of display apparatuses are a monitor apparatus connected to a personal computer (PC), a server computer, or the like, a portable computer apparatus, a navigation terminal, a television apparatus, an Internet Protocol Television (IPTV) apparatus, a portable terminal (for example, a smart phone, a tablet PC, Personal Digital Assistant (PDA), or a cellular phone), various kinds of displays used to reproduce images of advertisements or movies in industrial fields, and various kinds of audio/video systems.

A display apparatus includes a backlight unit (BLU) for supplying light to a liquid crystal panel, and the backlight unit includes a plurality of point light sources for emitting light independently. The light sources include, for example, Light Emitting Diodes (LEDs) or Organic Light Emitting Diodes (OLEDs).

Display apparatuses are getting thinner in thickness. Accordingly, an Optical Distance (OD) for changing point light sources to a surface light source is also being reduced. However, the display apparatuses should maintain brightness and uniformity of brightness even at such reduced optical distances.

SUMMARY

Provided is a display apparatus that may increase a light diffusing function of light emitting diodes to achieve product slimness while raising a contrast ratio and color reproduction by configuring a backlight unit (BLU) with red light emitting diodes, green light emitting diodes, and a blue light emitting diodes and causing distributed Bragg reflectors (DBRs) of the red light emitting diodes, the green light emitting diodes, and the blue light emitting diodes to have similar reflectivities according to an incident angle.

Additional aspects will be set forth in part in the description which follows and, in part, will be apparent from the description, or may be learned by practice of the presented embodiment.

According to an aspect of the disclosure, a display apparatus includes: a liquid crystal panel; and a backlight unit configured to provide light to the liquid crystal panel, wherein the backlight unit includes: a substrate; and a plurality of light emitting diode groups provided on an upper surface of the substrate, wherein each of the plurality of light emitting diode groups includes a red light emitting diode, a green light emitting diode, and a blue light emitting diode, wherein each of the red light emitting diode, the green light emitting diode, and the blue light emitting diode includes: a light emitting layer; and a distributed Bragg reflector (DBR) provided on the light emitting layer, and wherein reflectivities of the distributed Bragg reflectors of the red light emitting diode, the green light emitting diode, and the blue light emitting diode are within a same range of reflectivity according to an incident angle of light incident on the distributed Bragg reflectors.

A reflectivity of the distributed Bragg reflector of each of the red light emitting diode, the green light emitting diode, and the blue light emitting diode may be reduced as an incident angle of light increases.

A reflectivity of the distributed Bragg reflector of each of the red light emitting diode, the green light emitting diode, and the blue light emitting diode may be constant with respect to light having an incident angle that is smaller than a preset angle, and the reflectivity of the distributed Bragg reflector of each of the red light emitting diode, the green light emitting diode, and the blue light emitting diode may be reduced, with respect to light having an incident angle that is greater than or equal to the preset angle, as the incident angle of the light increases.

The reflectivity of the distributed Bragg reflector of each of the red light emitting diode, the green light emitting diode, and the blue light emitting diode may be between 90% and 100% with respect to the light having the incident angle that is smaller than the preset angle.

The reflectivity of the distributed Bragg reflector of each of the red light emitting diode, the green light emitting diode, and the blue light emitting diode may be between 50% and 80% with respect to light having an incident angle of 60 degrees that is greater than or equal to the preset angle.

The distributed Bragg reflector of each of the red light emitting diode, the green light emitting diode, and the blue light emitting diode may include titanium dioxide (TiO2) layers and silicon dioxide ($SiO_2$) layers that are alternately stacked, and thicknesses of at least one of the titanium dioxide layers or the silicon dioxide layers may be different in the distributed Bragg reflectors of the red light emitting diode, the green light emitting diode, and the blue light emitting diode such that the reflectivities of the distributed Bragg reflectors are within the same range of reflectivity according to an incident angle of light.

A thickness of a titanium dioxide layer of the distributed Bragg reflector of the red light emitting diode may be greater than a thickness of a titanium dioxide layer of the distributed Bragg reflector of the green light emitting diode, and the thickness of the titanium dioxide layer of the distributed Bragg reflector of the green light emitting diode may greater than a thickness of a titanium dioxide layer of the distributed Bragg reflector of the blue light emitting diode.

The backlight unit may further include a plurality of optical domes respectively covering the plurality of light emitting diode groups.

The plurality of light emitting diode groups may be arranged in a two-dimensional matrix on the upper surface of the substrate.

Each of the red light emitting diode, the green light emitting diode, and the blue light emitting diode may further include a lower distributed Bragg reflector provided below the light emitting layer, and reflectivities of the lower distributed Bragg reflectors of the red light emitting diode, the green light emitting diode, and the blue light emitting diode may be within the same range of reflectivity according to an incident angle of light incident on the lower distributed Bragg reflectors.

According to an aspect of the disclosure, a display apparatus including: a liquid crystal panel; and a backlight unit configured to supply light to the liquid crystal panel, wherein the backlight unit includes: a substrate; a plurality of light emitting diode groups provided on an upper surface of the substrate, wherein each of the plurality of light emitting diode groups includes a green light emitting diode and a blue light emitting diode; and a red color conversion sheet provided above the plurality of light emitting diode groups, wherein each of the green light emitting diode and the blue light emitting diode includes: a light emitting layer; and a distributed Bragg reflector (DBR) positioned on the light emitting layer, and wherein reflectivities of the distributed Bragg reflectors of the green light emitting diode and the blue light emitting diode are within a same range of reflectivity according to an incident angle of light incident on the distributed Bragg reflectors of the green light emitting diode and the blue light emitting diode.

A reflectivity of the distributed Bragg reflector may be reduced as an incident angle of light increases.

The reflectivity of the distributed Bragg reflector of each of the green light emitting diode and the blue light emitting diode may be constant with respect to light having an incident angle that is smaller than a preset angle, and the reflectivity of the distributed Bragg reflector of each of the green light emitting diode and the blue light emitting diode may be reduced, with respect to light of an incident angle that is greater than or equal to the preset angle, as the incident angle of the light increases.

The reflectivity of the distributed Bragg reflector of each of the green light emitting diode and the blue light emitting diode may be between 90% and 100% with respect to light having the incident angle that is smaller than the preset angle.

The reflectivity of the distributed Bragg reflector of each of the green light emitting diode and the blue light emitting diode may be between 50% and 80% with respect to light having an incident angle of 60 degrees that is greater than the preset angle.

BRIEF DESCRIPTION OF THE DRAWINGS

The above and other aspects, features, and advantages of certain embodiments of the present disclosure will become apparent from the following description, taken in conjunction with the accompanying drawings of which.

DETAILED DESCRIPTION

Figure 1:
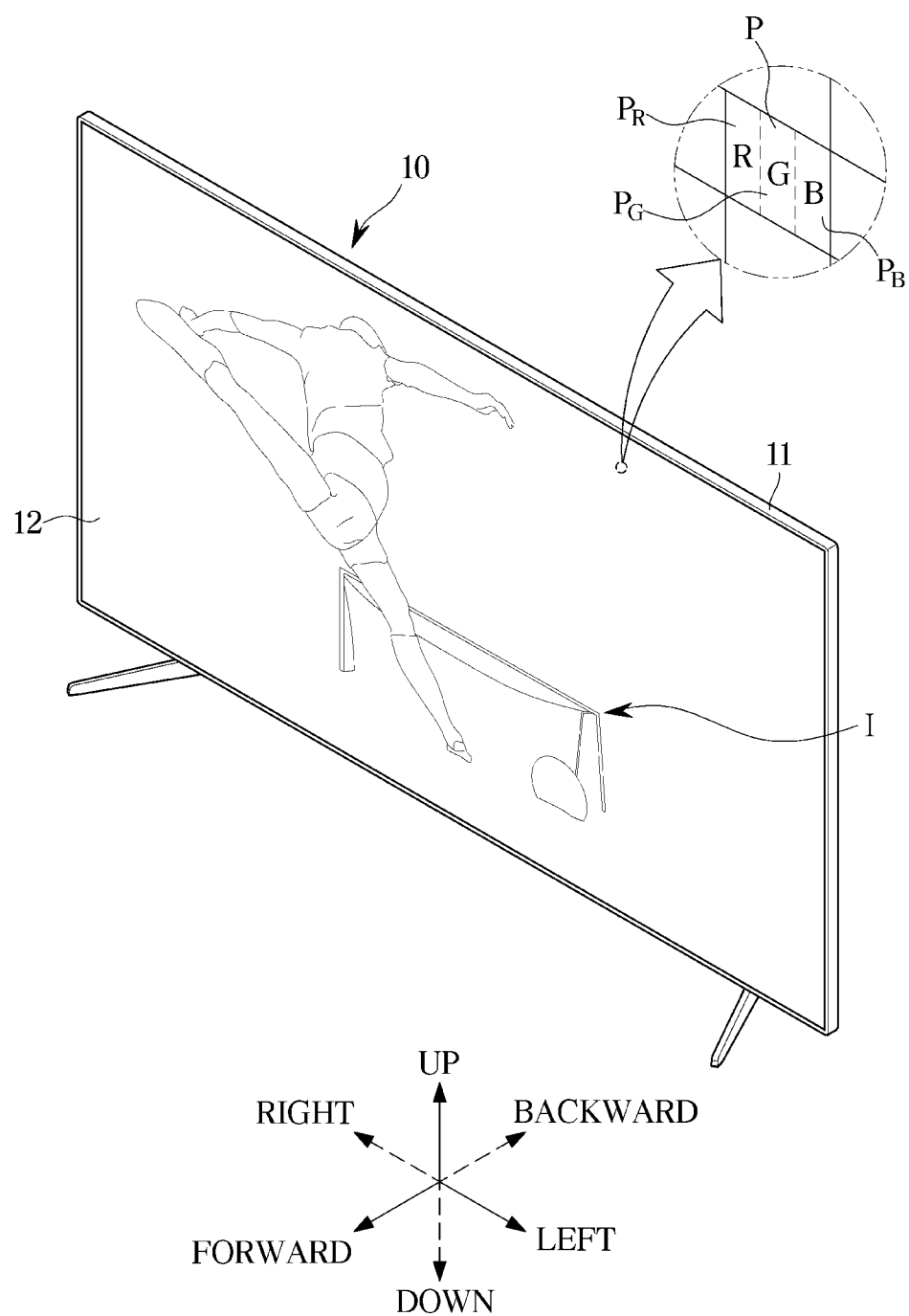
FIG. 1 shows an example of an outer appearance of a display apparatus according to an embodiment of the disclosure.

Throughout this specification, like reference numerals will refer to like components. The present specification does not describe all elements of embodiments, and descriptions about content being general in the technical art to which the disclosure belongs or overlapping content between the embodiments will be omitted. As used herein, the terms "portion", "part, "module, "member" or "block" may be implemented as software or hardware, and according to embodiments, a plurality of "portions", "parts, "modules, "members" or "blocks" may be implemented as a single component, or a single "portion", "part, "module, "member" or "block" may include a plurality of components.

Through this specification, it will be understood that when a certain part is referred to as being "connected" to another part, it can be directly or indirectly connected to the other part. When a part is indirectly connected to another part, it may be connected to the other part through a wireless communication network.

Also, it will be understood that when a certain part "includes" a certain component, the part does not exclude another component but can further include another component, unless the context clearly dictates otherwise.

In the entire specification, it will also be understood that when an element is referred to as being "on" or "over" another element, it can be directly on the other element or intervening elements may also be present.

The terms "first", "second", etc., may be used to distinguish one component from another, and components are not limited by these terms.

An expression used in the singular encompasses the expression of the plural, unless it has a clearly different meaning in the context.

Reference numerals used in operations are provided for convenience of description, without describing the order of the operations, and the operations can be executed in a different order from the stated order unless a specific order is definitely specified in the context.

Throughout the disclosure, the expression "at least one of a, b or c" indicates only a, only b, only c, both a and b, both a and c, both b and c, all of a, b, and c, or variations thereof.

Hereinafter, an operation principle and embodiments of the disclosure will be described with reference to the accompanying drawings.

FIG. 1 shows an example of an outer appearance of a display apparatus according to an embodiment of the disclosure.

Referring to FIG. 1, a display apparatus 10 may process an image signal received from outside to generate an image, and visually display the image. Hereinafter, the display apparatus 10 is assumed to be a television (TV). However, the display apparatus 10 may be implemented as one of various apparatuses, such as a monitor, a portable multimedia apparatus, a portable communication apparatus, etc. That is, the display apparatus 10 may be any kind of apparatus that visually displays images.

Also, the display apparatus 10 may be a large format display (LFD) that is installed in an outdoor space, such as the top of building or a bus stop. The outdoor space is not limited to open-air spaces, and the display apparatus 10 according to an embodiment of the disclosure may be installed in any place where many people come in and out, such as a subway station, a shopping mall, a theater, an office, a store, etc., although the place is an indoor space.

The display apparatus 10 may receive content including a video signal and an audio signal from various content sources, and output video and audio corresponding to the video signal and audio signal. For example, the display apparatus 10 may receive content data through a broadcasting reception antenna or a wired cable, receive content data from a content reproducing apparatus, or receive content data from a content providing server of a content provider.

As shown in FIG. 1, the display apparatus 10 may include a main body 11, and a screen 12 displaying an image I.

The main body 11 may form an outer appearance of the display apparatus 10, and components for enabling the display apparatus 10 to display an image I or perform various functions may be installed inside the main body 11. The main body 11 shown in FIG. 1 may be in a shape of a flat plate, however, the shape of the main body 11 is not limited to that shown in FIG. 1. For example, the main body 11 may be in a shape of a curved plate.

The screen 12 may be formed on a front surface of the main body 11 and display an image I. For example, the screen 12 may display a still image or a moving image. Also, the screen 12 may display a two-dimensional image or a three-dimensional image using a user's binocular disparity.

The screen 12 may include a liquid crystal panel for transmitting or blocking light emitted from a backlight unit (BLU), etc.

In the screen 12, a plurality of pixels P may be formed, and an image I displayed on the screen 12 may be formed by light emitted from the plurality of pixels P. For example, light emitted from the plurality of pixels P may be combined like a mosaic to form an image I on the screen 12.

Each of the plurality of pixels P may emit light of various brightness and various colors. To emit light of various colors, each of the plurality of pixels P may include a plurality of sub pixels $P_R$, $P_G$, and $P_B$.

The sub pixels $P_R$, $P_G$, and $P_B$ may include a red sub pixel $P_R$ capable of emitting red light, a green sub pixel $P_G$ capable of emitting green light, and a blue sub pixel $P_B$ capable of emitting blue light. For example, the red light may correspond to light of a wavelength range from about 700 nm (nanometer, one billionth of a meter) to about 800 nm, the green light may correspond to light of a wavelength range from about 500 nm to about 600 nm, and the blue light may correspond to light of a wavelength range from about 400 nm to about 500 nm.

Each of the plurality of pixels P may emit light of various brightness and various colors by a combination of red light from the red sub pixel $P_R$, green light from the green sub pixel $P_G$, and blue light from the blue sub pixel $P_B$.

Figure 2:
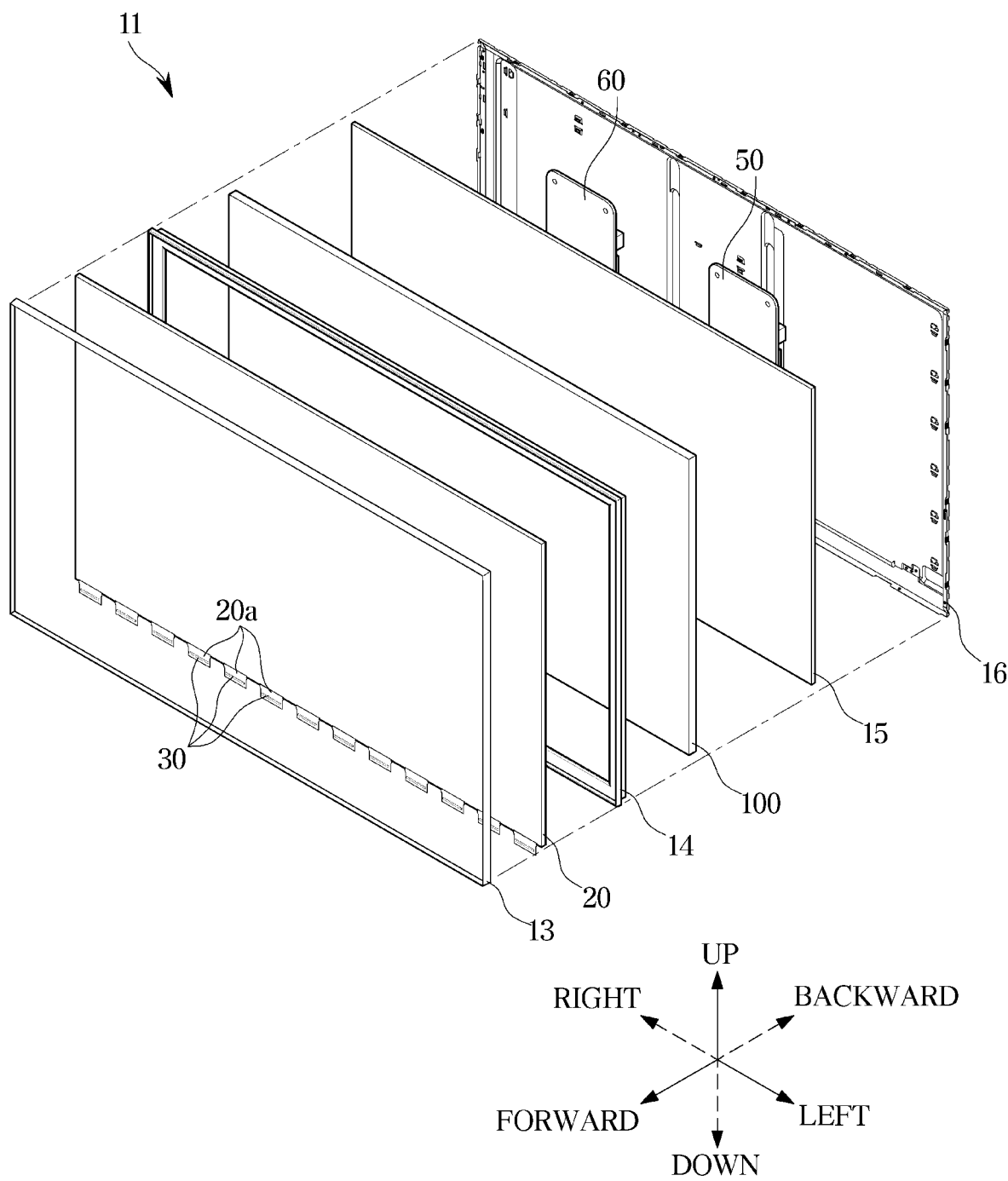
FIG. 2 shows an example of a structure of a display apparatus according to an embodiment of the disclosure.
Figure 3:
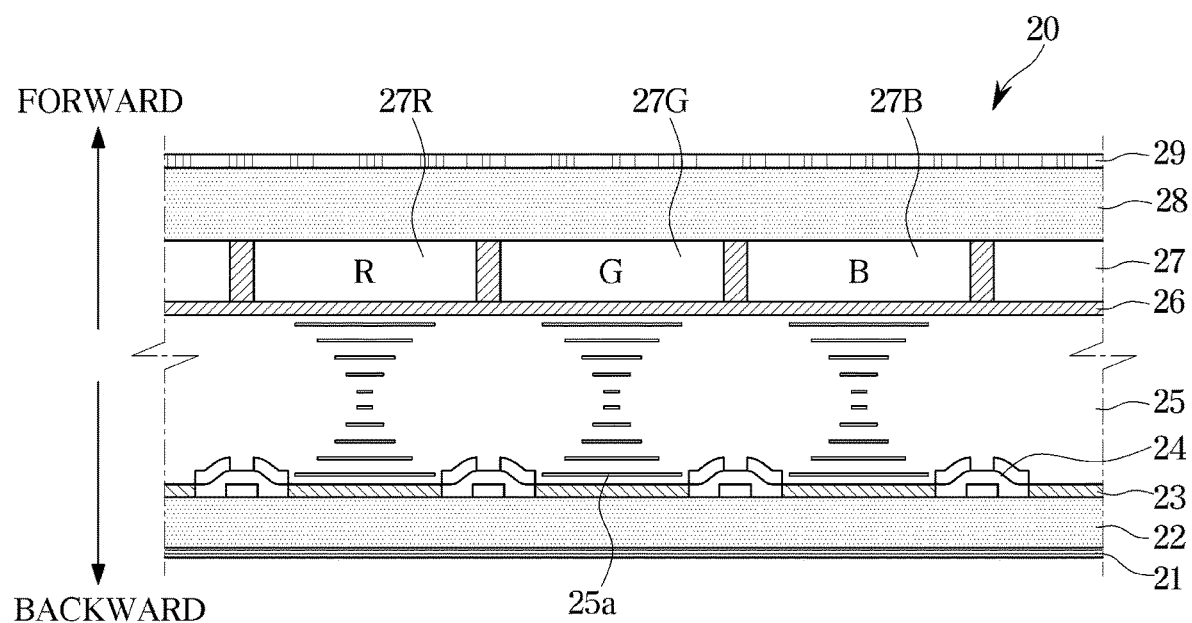
FIG. 3 shows an example of a liquid crystal panel included in a display apparatus according to an embodiment of the disclosure.

FIG. 2 shows an example of a structure of the display apparatus 10 according to an embodiment of the disclosure, and FIG. 3 shows an example of a liquid crystal panel included in the display apparatus 10 according to an embodiment of the disclosure.

As shown in FIG. 2, various components for displaying an image I on the screen S may be installed inside the main body 11.

For example, a backlight unit 100 being a surface light source, a liquid crystal panel 20 for transmitting or blocking light emitted from the backlight unit 100, a control assembly 50 for controlling operations of the backlight unit 100 and the liquid crystal panel 20, and a power assembly 60 for supplying power to the backlight unit 100 and the liquid crystal panel 20 may be provided in the main body 11. Also, the main body 11 may include a bezel 13, a frame middle mold 14, a bottom chassis 15, and a rear cover 16 for supporting the liquid crystal panel 20, the backlight unit 100, the control assembly 50, and the power assembly 60.

The backlight unit 100 may include a point light source for emitting white light. Also, the backlight unit 100 may refract, reflect, and scatter light emitted from the point light source to convert the light into uniform surface light. As such, the backlight unit 100 may emit uniform surface light toward a front direction by refracting, reflecting, and scattering light emitted from the point light source.

The backlight unit 100 will be described in more detail, below.

The liquid crystal panel 20 may be positioned in front of the backlight unit 100, and block or transmit light emitted from the backlight unit 100 to form an image I.

A front surface of the liquid crystal panel 20 may form the above-described screen S of the display apparatus 10, and the liquid crystal panel 20 may form the plurality of pixels P. Each of the plurality of pixels P of the liquid crystal panel 20 may independently block or transmit light emitted from the backlight unit 100. Also, light transmitted by the plurality of pixels P may form an image I that is displayed on the screen S.

For example, as shown in FIG. 3, the liquid crystal panel 20 may include a first polarizing film 21, a first transparent substrate 22, a pixel electrode 23, a thin film transistor 24, a liquid crystal layer 25, a common electrode 26, a color filter 27, a second transparent substrate 28, and a second polarizing film 29.

The first transparent substrate 22 and the second transparent substrate 28 may fix and support the pixel electrode 23, the thin film transistor 24, the liquid crystal layer 25, the common electrode 26, and the color filter 27. The first and second transparent substrates 22 and 28 may be made of tempered glass or a transparent resin.

On outer surfaces of the first and second transparent substrates 22 and 28, the first polarizing film 21 and the second polarizing film 29 may be respectively positioned. The first polarizing film 21 and the second polarizing film 29 may transmit certain polarized light and block (reflect or absorb) the other polarized light. For example, the first polarizing film 21 may transmit polarized light traveling toward a first direction and block (reflect or absorb) the other polarized light. Also, the second polarizing film 29 may transmit polarized light traveling toward a second direction and block (reflect or absorb) the other polarized light, wherein the second direction may be orthogonal to the first direction. Accordingly, polarized light transmitted by the first polarizing film 21 may be not directly transmitted through the second polarizing film 29.

The color filter 27 may be provided on an inner side of the second transparent substrate 28. The color filter 27 may include, for example, a red filter 27R transmitting red light, a green filter 27G transmitting green light, and a blue filter 27G transmitting blue light. Also, the red filter 27R, the green filter 27G, and the blue filter 28B may be arranged side by side. An area occupied by the color filter 27 may correspond to a pixel P described above. An area occupied by the red filter 27R may correspond to a red sub pixel $P_R$, an area occupied by the green filter 27G may correspond to a green sub pixel $P_G$, and an area occupied by the blue filter 27B may correspond to a blue sub pixel $P_B$.

The pixel electrode 23 may be provided on an inner side of the first transparent substrate 22, and the common electrode 26 may be provided on the inner side of the second transparent substrate 28. The pixel electrode 23 and the common electrode 26 may be made of a metal material carrying electricity, and form an electric field for changing arrangement of liquid crystal molecules 115a configuring the liquid crystal layer 25 which will be described below.

On the inner surface of the first transparent substrate 22, the thin film transistor 24 may be positioned. The thin film transistor 24 may be turned on (closed) or turned off (opened) by image data provided from the panel driver 30. Also, according to turning-on (closing) or turning-off (opening) of the thin film transistor 24, an electric field may be formed or removed between the pixel electrode 23 and the common electrode 26.

The liquid crystal layer 25 may be formed between the pixel electrode 23 and the common electrode 26, and the liquid crystal layer 25 may be filled with the liquid crystal molecules 25a. Liquid crystal is in an intermediate state between a solid (crystal) state and a liquid state. The liquid crystal shows an optical property according to a change in electric field. For example, the direction of the molecular arrangement of liquid crystal changes according to a change in electric field. As a result, the optical property of the liquid crystal layer 25 may change according to the presence/absence of an electric field passing through the liquid crystal layer 25. For example, the liquid crystal layer 25 may rotate a polarizing direction of light with respect to an optical axis according to presence/absence of an electric field. Thereby, a polarizing direction of polarized light passed through the first polarizing film 21 may rotate while the polarized light passes through the liquid crystal layer 25, and then the resultant polarized light may pass through the second polarizing film 29.

At one edge of the liquid crystal panel 20, a cable 20a for transmitting image data to the liquid crystal panel 20, and a display driver integrated circuit (DDI) (hereinafter, referred to as a 'panel driver') 30 for processing digital image data and outputting an analog image signal may be provided.

The cable 20a may electrically connect the control assembly 50/power assembly 60 to the panel driver 30, and also electrically connect the panel driver 30 to the liquid crystal panel 20. The cable 20a may include a flexible flat cable or a film cable.

The panel driver 30 may receive image data and power from the control assembly 50/power assembly 60 through the cable 20a. Also, the panel driver 30 may provide image data and driving current to the liquid crystal panel 20 through the cable 20a.

Also, the cable 20a and the panel driver 30 may be integrated into one body and implemented as a film cable, a chip on film (COF), a tape carrier package (TCP), etc. In other words, the panel driver 30 may be positioned on the cable 20a, although not limited thereto. However, the panel driver 30 may be positioned on the liquid crystal panel 20.

The control assembly 50 may include a control circuit for controlling operations of the liquid crystal panel 20 and the backlight unit 100. For example, the control circuit may process a video signal and/or an audio signal received from an external content source. The control circuit may transmit image data to the liquid crystal panel 20, and transmit dimming data to the backlight unit 100.

The power assembly 60 may include a power circuit for supplying power to the liquid crystal panel 20 and the backlight unit 100. The power circuit may supply power to the control assembly 50, the backlight unit 199, and the liquid crystal panel 20.

The control assembly 50 and the power assembly 60 may be implemented with a printed circuit board and various kinds of circuits mounted on the printed circuit board. For example, the power circuit may include a capacitor, a coil, a resistor device, a processor, and a power circuit board on which the capacitor, the coil, the resistor device, and the processor are mounted. Also, the control circuit may include a memory, a processor, and a control circuit board on which the memory and the processor are mounted.

Figure 4:
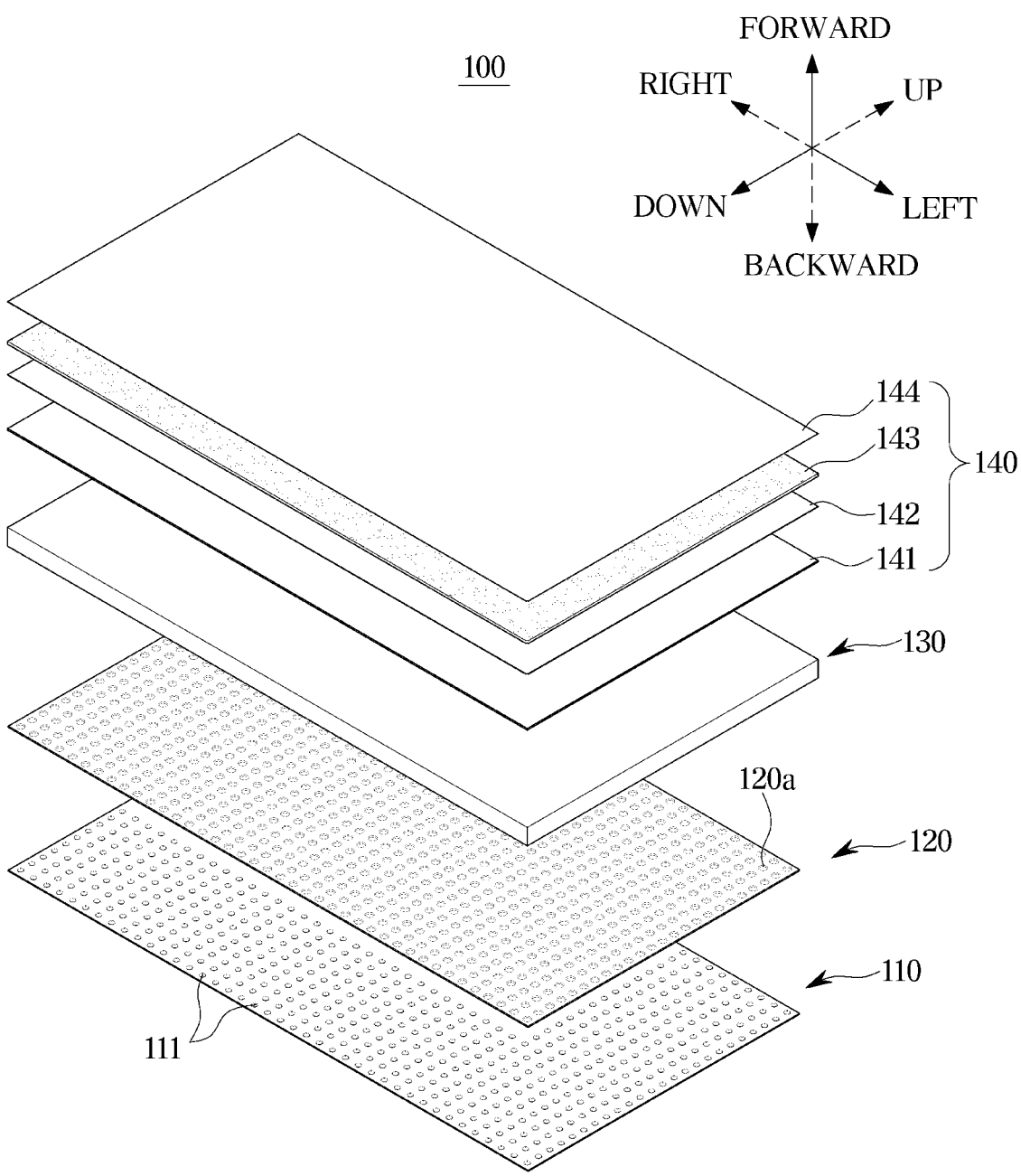
FIG. 4 shows an example of a backlight unit included in a display apparatus according to an embodiment of the disclosure.
Figure 5:
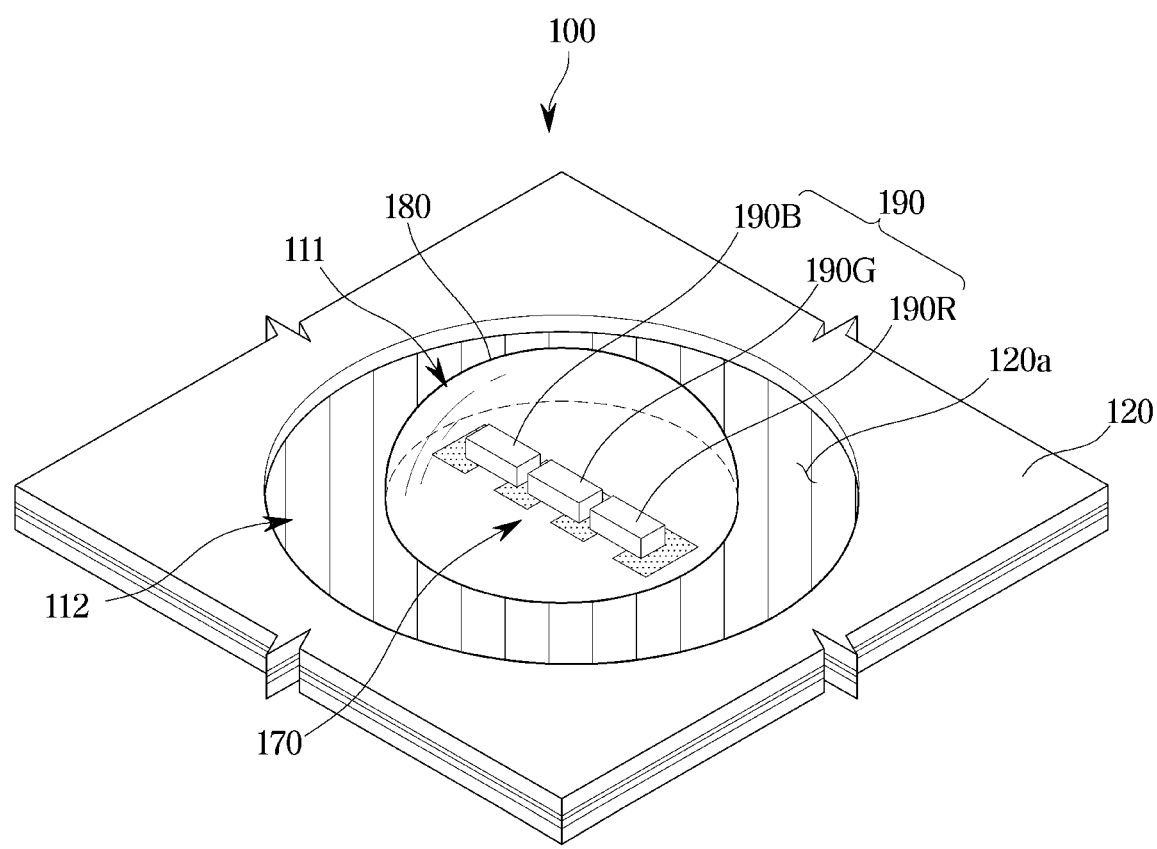
FIG. 5 shows an example of a light source included in a backlight unit according to an embodiment of the disclosure.

FIG. 4 shows an example of the backlight unit 100 included in the display apparatus 10 according to an embodiment of the disclosure, and FIG. 5 shows an example of a light source included in the backlight unit 100 according to an embodiment of the disclosure.

As shown in FIG. 4, the backlight unit 100 may include a light source module 110 for generating light, a reflective sheet 120 for reflecting light, a diffuser plate 130 for uniformly diffusing light, and an optical sheet 140 for improving brightness of exit light.

The light source module 110 may include a plurality of light sources 111 for emitting light, and a substrate 112 for supporting/fixing the plurality of light sources 111.

The plurality of light sources 111 may be arranged in a preset pattern to emit light with uniform brightness. The plurality of light sources 111 may be arranged such that distances between each light source and the neighboring light sources are the same.

For example, as shown in FIG. 4, the plurality of light sources 111 may be arranged in regular rows and columns. Accordingly, the plurality of light sources 111 may be arranged such that four neighboring light sources form substantially a square. Also, any one light source may be adjacent to four light sources, and distances between the light source and the four adjacent light sources may be substantially the same.

The light source module 110 may include a plurality of light emitting diode groups 170 positioned on an upper surface of the substrate 112, wherein each of the light emitting diode groups 170 includes a red light emitting diode (LED) 190R, a green light emitting diode 190G, and a blue light emitting diode 190B.

According to some embodiments of the disclosure, each light emitting diode 190 (190R, 190G, 190B) may correspond to a mini LED of which one side has a length of 500 micrometers or smaller.

One light source 111 may include one light emitting diode group 170. That is, one light source 111 may include a red light emitting diode 190R, a green light emitting diode 190G, and a blue light emitting diode 190B, as shown in FIG. 5.

The plurality of light emitting diode groups 170 may be arranged in a form of a two-dimensional matrix on the upper surface of the substrate 112. That is, as shown in FIG. 4, the plurality of light sources 111 may be arranged in regular rows and columns, and accordingly, the plurality of light emitting diode groups 170 may be arranged in a form of a two-dimensional matrix.

Also, according to some embodiments of the disclosure, the plurality of light sources 111 may be arranged such that three neighboring light sources form substantially an equilateral triangle. In this case, one light source may be adjacent to six light sources, and, also, distances between the light source and the six adjacent light sources may be substantially the same.

However, an arrangement of the plurality of light sources 111 is not limited to the above-described arrangement, and the plurality of light sources 111 may be arranged in various ways to emit light with uniform brightness.

Each light source 111 may include a device capable of emitting, upon receiving power, white light (light having a plurality of peak wavelengths, for example, mixed light of red light, green light, and blue light) in various directions.

That is, each light source 111 may emit white light by including a red light emitting diode 190R, a green light emitting diode 190G, and a blue light emitting diode 190B.

As shown in FIG. 5, each of the plurality of light sources 111 may include a light emitting diode group 170 and an optical dome 180.

To implement a small thickness of the display apparatus 10, the backlight unit 100 may also have a small thickness. To implement a small thickness of the backlight unit 100, each of the plurality of light sources 111 may have a small thickness and a simple structure.

The light emitting diodes 190 (190R, 190G, and 190B) of the light emitting diode group 170 may be attached directly to the substrate 112 by a chip on board (COB) method. For example, a light source 111 may include a light emitting diode 190 formed by attaching a light emitting diode chip or a light emitting diode die directly to the substrate 112 without separate packaging.

The light emitting diode 190 may be manufactured in a flip chip type. The light emitting diode 190 of the flip chip type may be formed by welding, upon attaching a light emitting diode being a semiconductor device to the substrate 112, an electrode pattern of a semiconductor device as it is to the substrate 112 without using a middle medium, such as a metal lead (wire) or a ball grid array (BGA). As such, by not using a metal lead (wire) or a ball grid array, the light source 111 including the light emitting diode 190 of the flip chip type may be miniaturized.

So far, the light emitting diode 190 of the flip chip type welded directly to the substrate 112 by the chip on board method has been described. However, the light source 111 is not limited to a light emitting diode of a flip chip type. For example, the light source 111 may include a light emitting diode of a package type.

The optical dome 180 may cover the light emitting diode group 170. That is, the optical dome 180 may cover the red light emitting diode 190R, the green light emitting diode 190G, and the blue light emitting diode 190B, included in the light emitting diode group 170.

The optical dome 180 may refract red light, green light, and blue light respectively emitted from the red light emitting diode 190R, the green light emitting diode 190G, and the blue light emitting diode 190B to mix the red light, green light, and blue light, and thereby emit white light.

As such, the optical dome 180 may emit white light by mixing red light, green light, and blue light, and reduce a distance required for mixing to white light, compared to a case in which no optical dome 180 exists, thereby reducing an optical distance OD required for changing point light sources to a surface light source.

Also, the optical dome 180 may prevent or suppress the light emitting diodes 190 from being damaged by a mechanical action from outside and/or by a chemical action.

The optical dome 180 may be in a shape of a dome resulting from cutting, for example, a sphere with a plane not including a center of the sphere, or in a shape of a hemisphere resulting from cutting a sphere with a plane including a center of the sphere. A vertical section of the optical dome 180 may be in a shape of, for example, a segment of a circle or a semicircle.

The optical dome 180 may be formed of silicon or an epoxy resin. For example, the optical dome 180 may be formed by discharging molten silicon or a molten epoxy resin onto the light emitting diodes 190 through a nozzle, etc. and then hardening the silicon or epoxy resin.

The optical dome 180 may be optically transparent or translucent. Light emitted from the light emitting diode 190 may pass through the optical dome 180 and be emitted to the outside.

At this time, the optical dome 180 being in a shape of a dome may refract the light, like a lens. For example, light emitted from the light emitting diodes 190 may be refracted by the optical dome 180 and dispersed.

As such, the optical dome 180 may protect the light emitting diodes 190 from an external mechanical and/or chemical action or an electrical action, and disperse light emitted from the light emitting diodes 190.

So far, the optical dome 180 being in a shape of a silicon dome has been described. However, the light source 111 is not limited to including the optical dome 180. For example, the light source 111 may include a lens for dispersing light emitted from the light emitting diodes 190.

The substrate 112 may fix the plurality of light sources 111 to prevent the light sources 111 from moving. Also, the substrate 112 may supply power for enabling the light sources 111 to emit light to the individual light sources 111.

The substrate 112 may fix the plurality of light sources 111. The substrate 112 may be configured with a synthetic resin, tempered glass, ora printed circuit board (PCB), on which a conductive power supply line for supplying power to the light sources 111 is formed.

In this case, the plurality of light emitting diode groups 170 may be provided on the upper surface of the substrate 112 to form an array, and a plurality of optical domes 180 may be provided to respectively correspond to the plurality of light emitting diode groups 170.

The reflective sheet 120 may reflect light emitted from the plurality of light sources 111 toward the front direction or toward an approximately front direction.

In the reflective sheet 120, a plurality of through holes 120a may be formed at locations respectively corresponding to the plurality of light sources 111 of the light source module 110. Also, the light sources 111 of the light source module 110 may pass through the through holes 120a, and protrude forward from the reflective sheet 120. Accordingly, the plurality of light sources 111 may emit light in the front direction from the reflective sheet 120. The reflective sheet 120 may reflect light emitted toward the reflective sheet 120 from the plurality of light sources 111 toward the diffuser plate 130.

The diffuser plate 130 may be provided in front of the light source module 110 and the reflective sheet 120. The diffuser plate 130 may uniformly disperse light emitted from the light sources 111 of the light source module 110.

As described above, the plurality of light sources 111 may be arranged at equidistant intervals on a rear surface of the backlight unit 100. Accordingly, brightness non-uniformity may occur according to the locations of the light sources 111.

The diffuser plate 130 may diffuse light emitted from the plurality of light sources 111a in the inside to remove brightness non-uniformity caused by the plurality of light sources 111. In other words, the diffuser plate 130 may uniformly emit non-uniform light emitted from the plurality of light sources 111 through the front surface.

The optical sheet 140 may include various sheets for improving brightness and uniformity of brightness. For example, the optical sheet 140 may include a light conversion sheet 141, a diffuser sheet 142, a prism sheet 143, and a reflective polarizing sheet 144.

However, the optical sheet 140 is not limited to the sheets or films shown in FIG. 4, and may omit one or more of the sheets or films shown in FIG. 4 and may include various other sheets or films such as a protective sheet.

Figure 6:
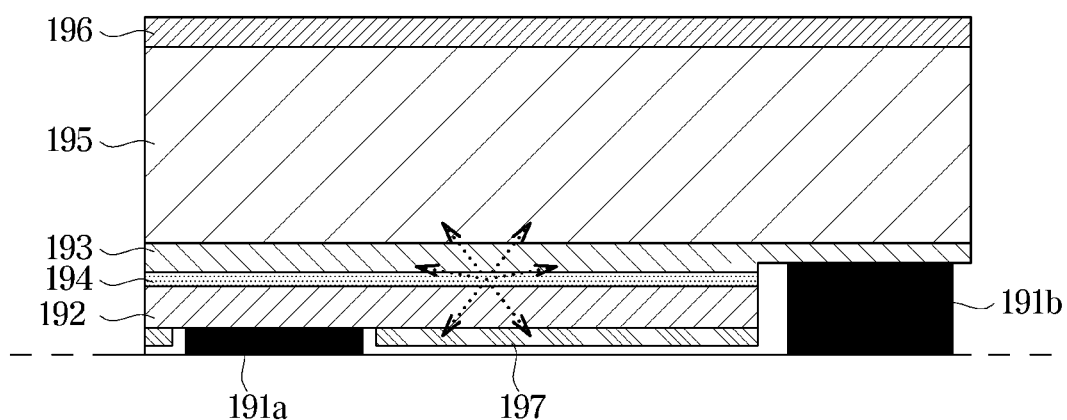
FIG. 6 shows an example of a light emitting diode included in a backlight unit according to an embodiment of the disclosure.
Figure 7:
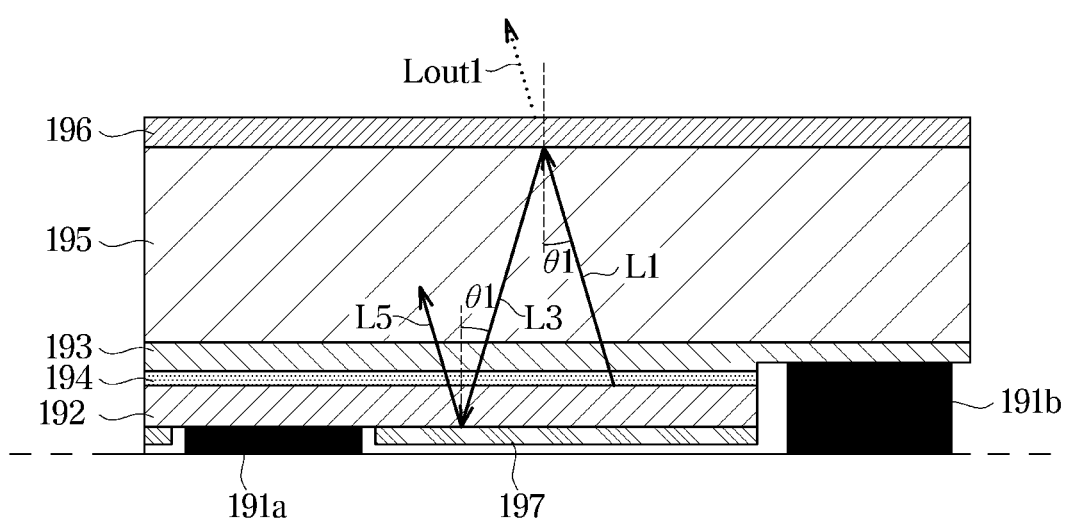
FIG. 7 shows an example in which light having a small incident angle is propagated in the light emitting diode shown in FIG. 6.
Figure 8:
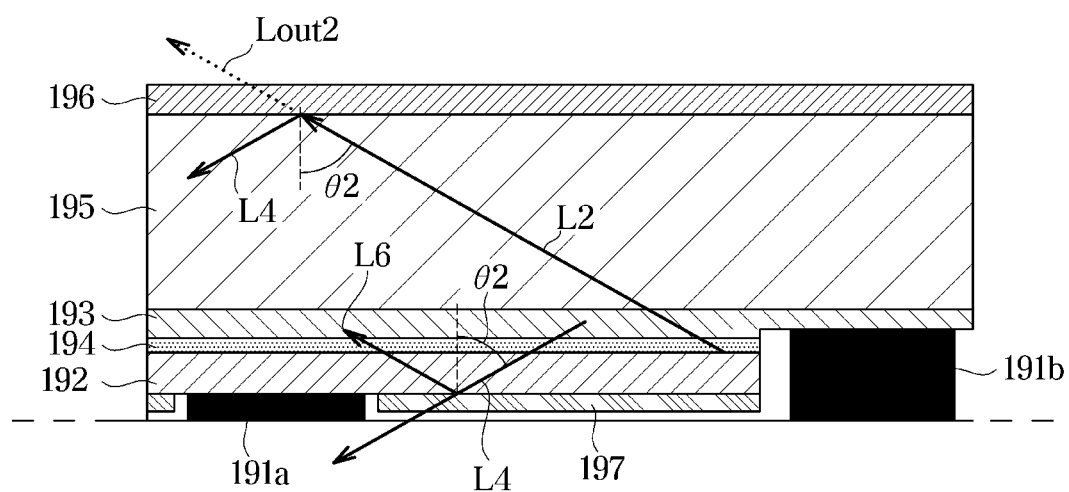
FIG. 8 shows an example in which light having a large incident angle is propagated in the light emitting diode shown in FIG. 6.
Figure 9:
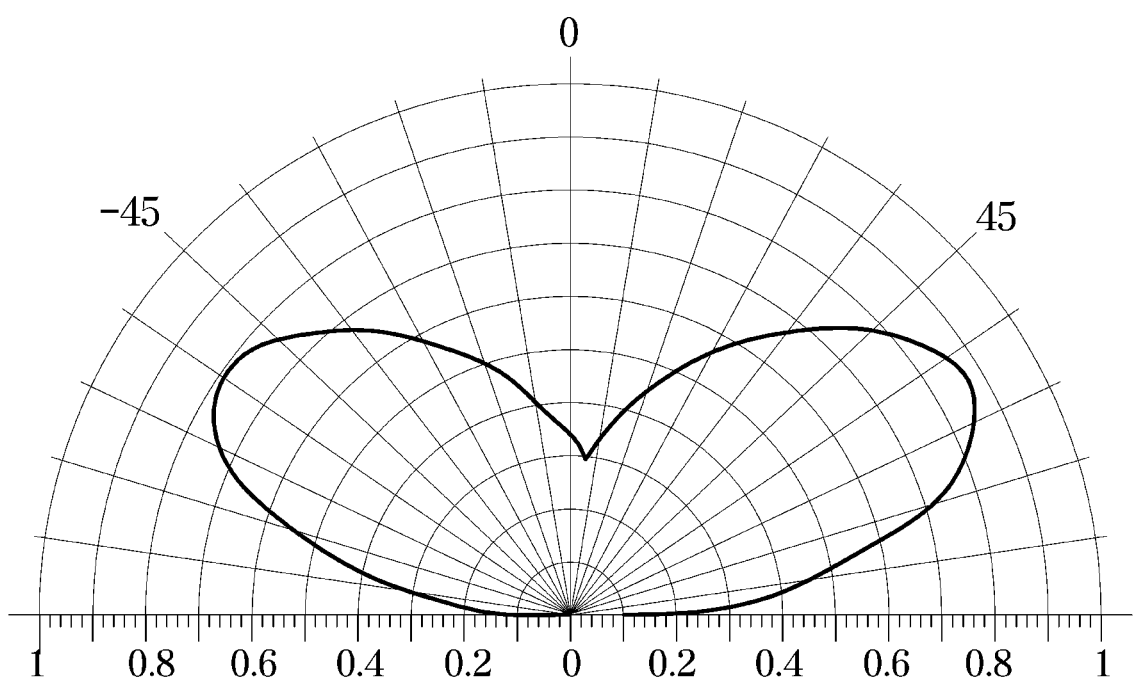
FIG. 9 shows intensities of light according to exit angles in the light emitting diode shown in FIG. 6.

FIG. 6 shows an example of the light emitting diode 190 included in the backlight unit 100 according to an embodiment of the disclosure, FIG. 7 shows an example in which light having a small incident angle is propagated in the light emitting diode 190 shown in FIG. 6, FIG. 8 shows an example in which light having a large incident angle is propagated in the light emitting diode 190 shown in FIG. 6, and FIG. 9 shows intensities of light according to exit angles in the light emitting diode 190 shown in FIG. 6.

Technical characteristics of the light emitting diode 190, which will be described below, may correspond to technical characteristics of the red light emitting diode 190R, the green light emitting diode 190G, and the blue light emitting diode 190B.

Referring to FIG. 6, the light emitting diode 190 may include a transparent substrate 195, an n-type semiconductor layer 193, and a p-type semiconductor layer 192. Also, a multi quantum wells (MQW) layer (or light emitting layer) 194 may be formed between the n-type semiconductor layer 193 and the p-type semiconductor layer 192.

The transparent substrate 195 may be a base of p-n junction capable of emitting light. The transparent substrate 195 may include, for example, sapphire ($Al_2O_3$) having a crystal structure that is similar to those of the n-type semiconductor layer 193 and the p-type semiconductor layer 192.

A pn junction may be implemented by connecting the n-type semiconductor layer 193 to the p-type semiconductor layer 192. A depletion region may be formed between the n-type semiconductor layer 193 and the p-type semiconductor layer 192. In the depletion layer, electrons of the n-type semiconductor layer 193 may be recombined with holes of the p-type semiconductor layer 192. By the recombination of the electrons with the holes, light may be emitted.

For example, in a junction of the n-type semiconductor layer 193 and the p-type semiconductor layer 192 of the red light emitting diode 190R, red light belonging to a wavelength range of 700 nm to 800 nm may be emitted.

In a junction of the n-type semiconductor layer 193 and the p-type semiconductor layer 192 of the green light emitting diode 190G, green light belonging to a wavelength range of 500 nm to 600 nm may be emitted.

In a junction of the n-type semiconductor layer 193 and the p-type semiconductor layer 192 of the blue light emitting diode 190B, blue light belonging to a wavelength range of 400 nm to 500 nm may be emitted.

A first electrode 191a of the light emitting diode 190 may be electrically in contact with the p-type semiconductor layer 192, and a second electrode 191b of the light emitting diode 190 may be electrically in contact with the n-type semiconductor layer 193. The first electrode 191a and the second electrode 191b may function as electrodes, as well as reflectors reflecting light.

According to a voltage applied to the light emitting diode 190, holes may be supplied to the p-type semiconductor layer 192 through the first electrode 191a, and electrons may be supplied to the n-type semiconductor layer 193 through the second electrode 191b. The electrons may be recombined with the holes in the depletion layer formed between the p-type semiconductor layer 192 and the n-type semiconductor layer 193. While the electrons are recombined with the holes, energy (kinetic energy and potential energy) of the electrons and holes may be converted into light energy. In other words, according to recombination of electrons and holes, light may be emitted.

At this time, an energy band gap of the multi quantum wells layer 194 may be smaller than an energy band gap of the p-type semiconductor layer 192 and/or the n-type semiconductor layer 193. Therefore, the holes and electrons may be captured by the multi quantum wells layer 194.

The holes and electrons captured by the multi quantum wells layer 194 may be easily recombined with each other in the multi quantum wells layer 194. Accordingly, light generation efficiency of the light emitting diodes 190 may be improved.

Light having a wavelength corresponding to the energy band gap of the multi quantum wells layer 194 may be emitted from the multi quantum wells layer 194. As such, the multi quantum wells layer 194 may correspond to a light emitting layer that emits light.

Light generated by the recombination of the electrons and holes may be emitted in all directions, without being emitted in a certain direction, as shown in FIG. 6. However, in the case of light emitted from a plane such as the multi quantum wells layer 194, generally, an intensity of light emitted in a direction being perpendicular to a light emitting surface is greatest, and an intensity of light emitted in a direction being parallel to the light emitting surface is smallest.

A first reflective layer 196 may be provided on an outer side (an upper side of the transparent substrate 195 in the drawing) of the transparent substrate 195. That is, the first reflective layer 196 may be positioned above the light emitting layer 194. Also, a second reflective layer 197 may be provided on an outer side (a lower side of the p-type semiconductor layer 192 in the drawing) of the p-type semiconductor layer 192. That is, the second reflective layer 197 may be positioned below the light emitting layer 194. As such, the transparent substrate 195, the n-type semiconductor layer 193, the multi quantum wells layer 194, and the p-type semiconductor layer 192 may be positioned between the first reflective layer 196 and the second reflective layer 197.

Each of the first reflective layer 196 and the second reflective layer 197 may reflect a part of incident light, and transmit the other part of the incident light. In this case, each of the first reflective layer 196 and the second reflective layer 197 may be a distributed Bragg reflector (DBR) formed by applying materials having different refraction indexes to have various reflectivities according to incident angles. The first reflective layer 196 may correspond to an upper distributed Bragg reflector located above the light emitting layer 194, and the second reflective layer 197 may correspond to a lower distributed Bragg reflector located below the light emitting layer 194.

For example, the first reflective layer 196 and the second reflective layer 197 may reflect light having a wavelength belonging to a certain wavelength range, and transmit light having a wavelength deviating from the certain wavelength range.

For example, the first reflective layer 196 and the second reflective layer 197 of the red light emitting diode 190R may reflect red light having a certain wavelength band emitted from the multi quantum wells layer 194, the first reflective layer 196 and the second reflective layer 197 of the green light emitting diode 190G may reflect green light having a certain wavelength band emitted from the multi quantum wells layer 194, and the first reflective layer 196 and the second reflective layer 197 of the blue light emitting diode 190B may reflect blue light having a certain wavelength band emitted from the multi quantum wells layer 194.

Also, the first reflective layer 196 and the second reflective layer 197 may reflect incident light having a certain incident angle, and transmit light deviating from the certain incident angle.

For example, the first reflective layer 196 may reflect light incident on the first reflective layer 196 at a small incident angle, and transmit light incident on the first reflective layer 196 at a large incident angle. Also, the second reflective layer 197 may reflect or transmit light incident on the second reflective layer 197 at a small incident angle, and reflect light incident on the second reflective layer 197 at a large incident angle.

As shown in FIG. 7, first light L1 generated by the multi quantum wells layer 194 may pass through the n-type semiconductor layer 193 and the transparent substrate 195 and then be propagated toward the first reflective layer 196. The first light L1 may be incident on the first reflective layer 196 at a first incident angle θ1. For example, the first incident light θ1 may be smaller than or equal to 40 degrees.

Also, as shown in FIG. 8, second light L2 generated by the multi quantum wells layer 194 may pass through the n-type semiconductor layer 193 and the transparent substrate 195 and then be propagated toward the first reflective layer 196. The second light L2 may be incident on the first reflective layer 196 at a second incident angle θ2. The second incident light θ2 of the second light L2 may be greater than the first incident light θ1 of the first light L1. For example, the second incident angle θ2 may be greater than or equal to 60 degrees.

A part Lout1 (hereinafter, referred to as "first exit light") of the first light L1 incident on the first reflective layer 196 may be transmitted through the first reflective layer 196, and the other part L3 (hereinafter, referred to as "third light") of the first light L1 may be reflected by the first reflective layer 196.

Also, a part Lout2 (hereinafter, referred to as "second exit light") of the second light L2 incident on the first reflective layer 196 may be transmitted through the first reflective layer 196, and the other part L4 (hereinafter, referred to as "fourth light") of the second light L2 may be reflected by the first reflective layer 196.

As described above, the first reflective layer 196 may reflect light incident on the first reflective layer 196 at a small incident angle, and transmit light incident on the first reflective layer 196 at a large incident angle.

In other words, a reflectivity of the first reflective layer 196 with respect to light incident on the first reflective layer 196 at a small incident angle may be large, and a reflectivity of the first reflective layer 196 with respect to light incident on the first reflective layer 196 at a large incident angle may be small. For example, a reflectivity of the first reflective layer 196 with respect to light having an incident angle of about 40 degrees or less may be about 80% or more, and a reflectivity of the first reflective layer 196 with respect to light having an incident angle of about 60 degrees may be between about 50% and about 80%.

Therefore, a large part of the first light L1 incident on the first reflective layer 196 at the first incident angle θ1 may be reflected, and only a small part of the first light L1 may be transmitted through the first reflective layer 196. Also, a large part of the second light L2 incident on the first reflective layer 196 at the second incident angle θ2 that is greater than the first incident angle θ1 may be transmitted through the first reflective layer 196.

As a result, an intensity of the second exit light Lout2 transmitted through the first reflective layer 196 may be greater than an intensity of the first exit light Lout1 transmitted through the first reflective layer 196. In this case, an exit angle of the second exit light Lout2 may be greater than an exit angle of the first exit light Lout1.

In other words, an intensity of light obliquely emitted from the light emitting diode 190 may be greater than an intensity of light emitted in a vertical-axis direction from the light emitting diode 190.

As shown in FIG. 7, the third light L3 generated by the multi quantum wells layer 194 or reflected by the first reflective layer 196 may be propagated toward the second reflective layer 197 via the p-type semiconductor layer 192. At this time, the third light L3 may incident on the second reflective layer 197 at the first incident angle θ1.

A part of the third light L3 incident on the second reflective layer 197 may be transmitted through the second reflective layer 197, and the other part L5 (hereinafter, referred to as "fifth light") of the third light L3 may be reflected by the second reflective layer 197.

Also, a part of the fourth light L4 incident on the second reflective layer 197 may be transmitted through the second reflective layer 197, and the other part L6 (hereinafter, referred to as "sixth light") of the fourth light L4 may be reflected by the second reflective layer 197.

As described above, the second reflective layer 197 may reflect or transmit light incident on the second reflective layer 197 at a small incident angle, and reflect light incident on the second reflective layer 197 at a large incident angle.

In other words, a reflectivity of the second reflective layer 197 with respect to light incident on the second reflective layer 197 at a large incident light may be great. Also, a reflectivity of the second reflective layer 197 with respect to light incident on the second reflective layer 197 at a small incident light may be not defined. For example, a reflectivity of the second reflective layer 197 with respect to light having an incident angle between about 60 degrees and about 80 degrees may be about 80% or more, and a reflectivity of the second reflective layer 197 with respect to light having an incident angle of about 40 degrees may be about 40% or more. As such, a reflectivity of the second reflective layer 197 with respect to light incident on the second reflective layer 197 at a large incident angle may be equal to or greater than a reflectivity of the second reflective layer 197 with respect to light incident on the second reflective layer 197 at a small incident angle.

Accordingly, a large part of the fourth light L4 incident on the second reflective layer 197 at the second incident angle θ2 may be reflected and then propagated toward the first reflective layer 196. Also, the third light L3 incident on the second reflective layer 197 at the first incident angle θ1 may be transmitted through the second reflective layer 197 or reflected by the second reflective layer 197.

As a result, a large part of the fourth light L4 incident on the second reflective layer 197 at the second incident angle θ2 may be again propagated toward the first reflective layer 196, transmitted through the first reflective layer 196, and then emitted to the outside of the light emitting diode 190. The third light L3 incident on the second reflective layer 197 at the first incident angle θ1 may be transmitted through the second reflective layer 197 and then absorbed in the substrate 112, or the third light L3 may be repeatedly reflected between the first reflective layer 196 and the second reflective layer 197 to thereby be absorbed in the transparent substrate 195, etc.

As such, a large part of light incident on the first reflective layer 196 at the first incident angle of 40 degrees or smaller may be not transmitted through the first reflective layer 196, and a large part of light incident on the first reflective layer 196 at the second incident angle of 60 degrees or more may be transmitted through the first reflective layer 196. Also, an intensity of light (light incident on the first reflective layer 196 at a small incident angle) emitted in a direction being perpendicular to the light emitting surface among light emitted from the multi quantum wells layer 194 may be greatest. Also, an intensity of light (light incident on the first reflective layer 196 at a large incident angle) emitted in a direction being parallel to the light emitting surface may be smallest.

Therefore, an intensity of light emitted in a direction (a upward direction of the light emitting diode 190 in the drawing) being perpendicular to an upper surface of the light emitting diode 190 may be smaller than an intensity of light emitted in a direction (a direction inclined to about 40 degrees to about 60 degrees with respect to the upward direction in the drawing) inclined with respect to the upper surface of the light emitting diode 190.

For example, as shown in FIG. 9, an intensity of light exiting at about 40 degrees to about 60 degrees with respect to a vertical axis of the light emitting diode 190 may be greatest. Referring to FIG. 9, the light emitting diode 190 may have a light profile being substantially in a shape of a bat wing. Herein, the light profile being in the shape of the bat wing may represent a light profile in which an intensity of light exiting in a direction (for example, a direction having an angle difference of about 50 degrees to about 60 degrees from the vertical axis being perpendicular to the light emitting surface) inclined from the light emitting layer (for example, the multi quantum wells layer) 194 of the light emitting diode 190 is greater than an intensity of light exiting in a direction being perpendicular to the light emitting layer 194 of the light emitting diode 190.

Due to the light emitting diode 190 having the light profile being in the shape of the bat wing, the number of the light emitting diodes 190 included in the display apparatus 10 may be reduced.

To improve image quality of the display apparatus 10, the backlight unit 100 may need to emit surface light having uniform brightness. For example, a reduction in number of the light emitting diodes 190 being point light sources may result in a greater brightness difference between an area where the light emitting diodes 190 exist and an area (area between the light emitting diodes 190) where the light emitting diodes 190 do not exist. In other words, a reduction in number of the light emitting diodes 190 being point light sources may deteriorate brightness uniformity of surface light emitted from the backlight unit 100.

The light emitting diodes 190 having a light profile being in a shape of a bat wing may reduce a brightness difference between the area where the light emitting diodes 190 exist and the area where the light emitting diodes 190 do not exist. Accordingly, it may be possible to reduce the number of the light emitting diodes 190.

Furthermore, a smaller thickness of the display apparatus 10 may require a shorter optical distance for dispersing light emitted from the light emitting diodes 190 being point light sources to surface light. Therefore, brightness uniformity of surface light emitted from the backlight unit 100 may deteriorate. To maintain brightness uniformity, the number of the light emitting diodes 190 may increase.

However, by using the light emitting diodes 190 having a light profile being in the shape of a bat wing, an increase in number of the light emitting diodes 190 may be minimized.

As such, the light emitting diodes 190 having the light profile being in the shape of the bat wing may improve brightness uniformity of the backlight unit 100. Accordingly, it may be possible to reduce the number of the light emitting diodes 190 while maintaining brightness uniformity of the backlight unit 100.

In this case, a reflectivity of the first reflective layer 196 and the second reflective layer 197, that is, the distributed Bragg reflectors according to an incident angle may be maintained uniform without depending on the type of the light emitting diodes 190. That is, the distributed Bragg reflectors of the red light emitting diode 190R, the green light emitting diode 190G, and the blue light emitting diode 190B may have the same reflectivity according to an incident angle of light. In other words, the distributed Bragg reflector of the red light emitting diode 190R, the distributed Bragg reflector of the green light emitting diode 190G, and the distributed Bragg reflector or the blue light emitting diode 190B may have the same reflectivity according to an incident angle of light. In the current embodiment of the disclosure, the same values may include values that are identical, and values being within a preset margin of error. That is, the distributed Bragg reflectors of the red light emitting diode 190R, the green light emitting diode 190G, and the blue light emitting diode 190B may have reflectivities within the same range of reflectivity according to an incident angle of light. In other words, the distributed Bragg reflectors of the red light emitting diode 190R, the green light emitting diode 190G, and the blue light emitting diode 190B may have reflectivities being within the same range (for example, 50% to 80%) of reflectivity at the same incident angle.

Therefore, the light emitting diodes 190 may have similar light profiles being in the shape of a bat wing even with respect to different colors of light emitted from the light emitting diodes 190, and improve brightness uniformity. In other words, the red light emitting diode 190R, the green light emitting diode 190G, and the blue light emitting diode 190B may have similar light profiles being in the shape of a bat wing, thereby further improving brightness uniformity and further reducing an optical distance.

Also, the light emitting diodes 190 may have an optimal light profile being in the shape of a bat wing even with respect to different colors of light emitted from the light emitting diodes 190, thereby increasing a light diffusing function of the light emitting diodes 190 and realizing product slimness. Also, by providing white light including red light, green light, and blue light having a small full width at half maximum to the liquid crystal panel 20 by using the red light emitting diode 190R, the green light emitting diode 190G, and the blue light emitting diode 190B, a high contrast ratio or color reproduction may be realized without using any colormetric material.

Hereinafter, the distributed Bragg reflectors of the red light emitting diode 190R, the green light emitting diode 190G, and the blue light emitting diode 190B, having reflectivities within the same range of reflectivity according to an incident angle of light, will be described in more detail.

Figure 10:
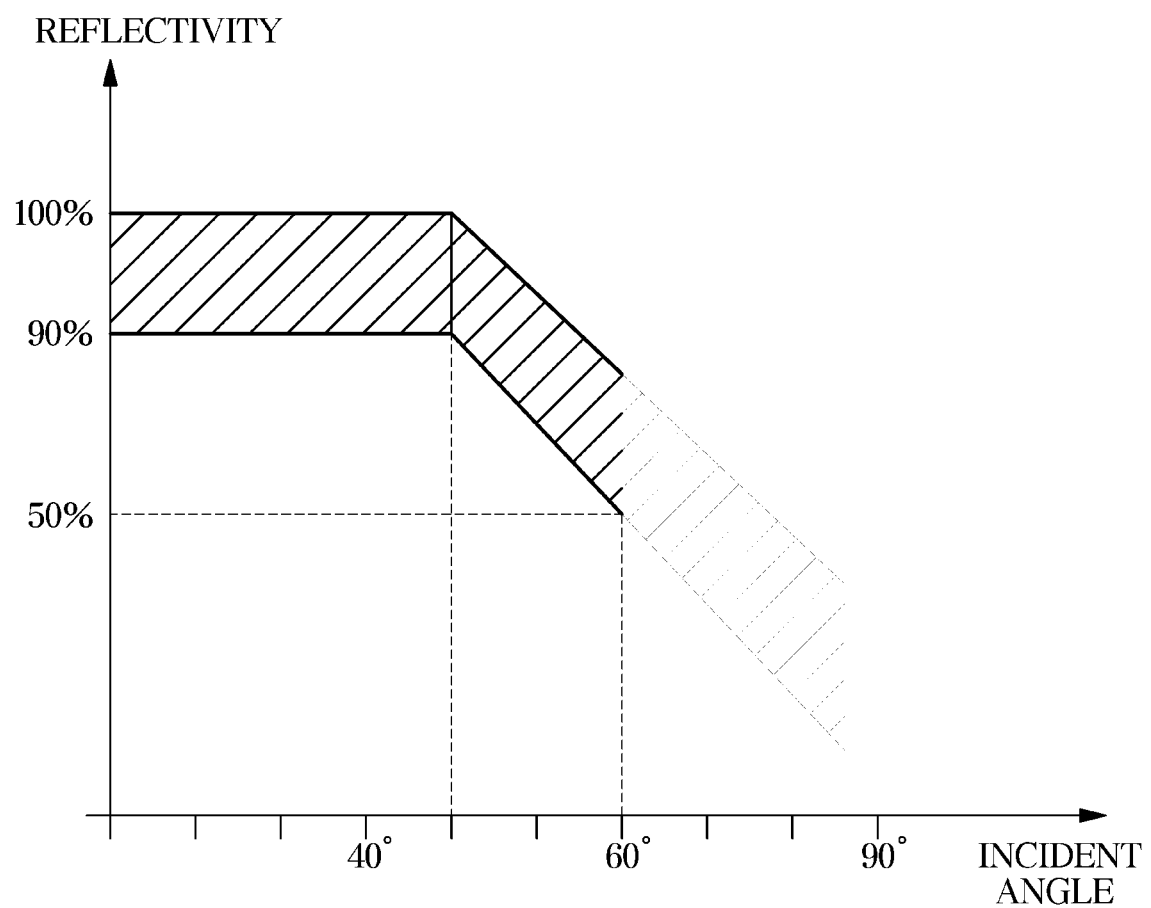
FIG. 10 shows reflectivities of a first reflective layer included in a light emitting diode according to an embodiment of the disclosure, according to incident angles.
Figure 11:
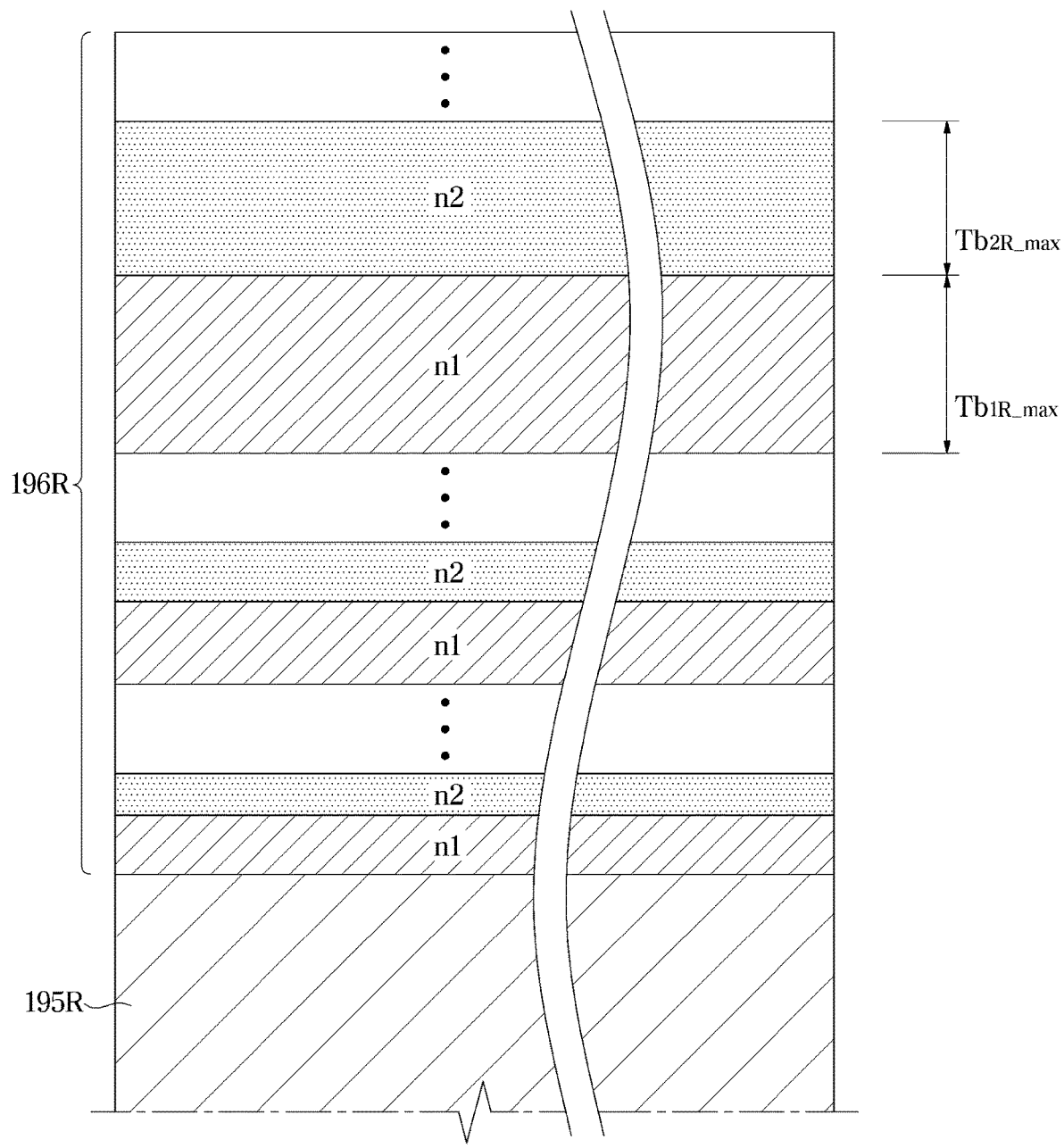
FIG. 11 shows an example of a first reflective layer of a red light emitting diode, having the reflectivities according to the incident angles shown in FIG. 10, according to an embodiment of the disclosure.
Figure 12:
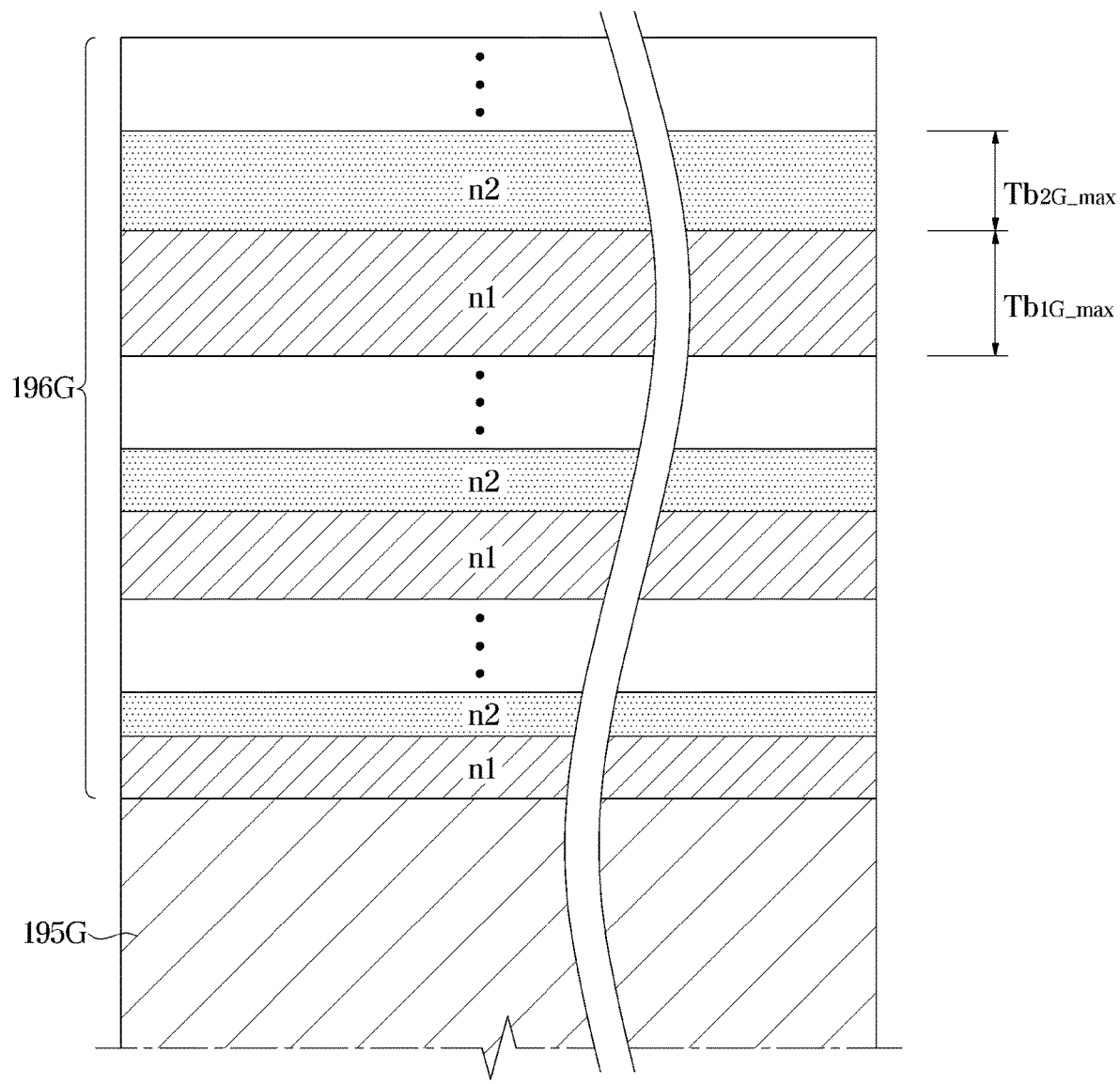
FIG. 12 shows an example of a first reflective layer of a green light emitting diode, having the reflectivities according to the incident angles shown in FIG. 10, according to an embodiment of the disclosure.
Figure 13:
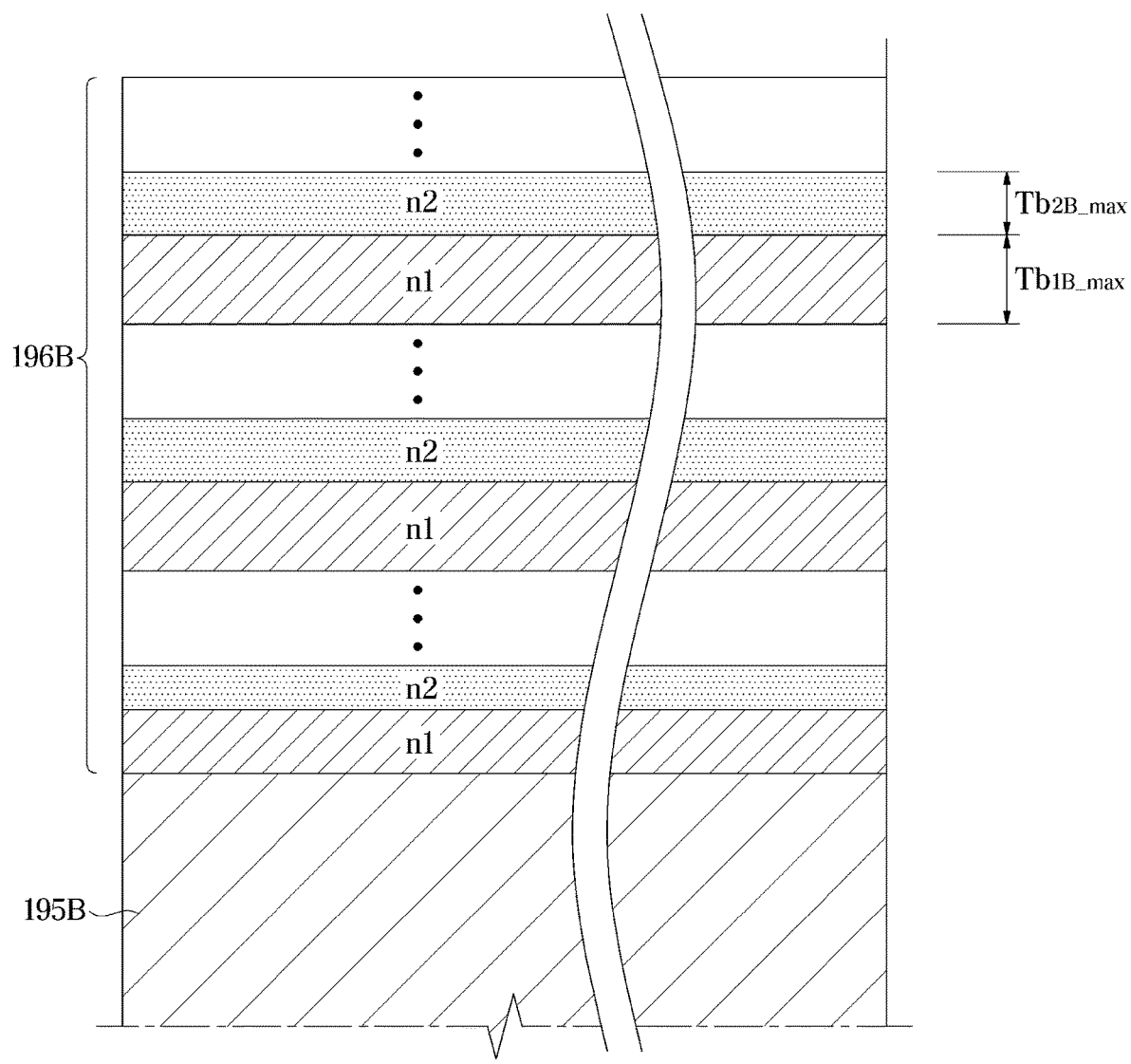
FIG. 13 shows an example of a first reflective layer of a blue light emitting diode, having the reflectivities according to the incident angles shown in FIG. 10, according to an embodiment of the disclosure.

FIG. 10 shows reflectivities of the first reflective layer 196 included in the light emitting diode 190 according to an embodiment of the disclosure, according to incident angles, FIG. 11 shows an example of the first reflective layer 196 of the red light emitting diode 190R, having the reflectivities according to the incident angles shown in FIG. 10, according to an embodiment of the disclosure, FIG. 12 shows an example of the first reflective layer 196 of the green light emitting diode 190G, having the reflectivities according to the incident angles shown in FIG. 10, according to an embodiment of the disclosure, and FIG. 13 shows an example of the first reflective layer 196 of the blue light emitting diode 190B, having the reflectivities according to the incident angles shown in FIG. 10, according to an embodiment of the disclosure.

Referring to FIG. 10, a reflectivity of the first reflective layer 196 included in the light emitting diode 190 may be reduced as an incident angle of light increases. That is, the first reflective layer (upper distributed Bragg reflector) 196 may have a reflectivity that is reduced as an incident angle of light increases.

For example, the first reflective layer 196 may have a constant reflectivity with respect to light having an incident angle that is smaller than a preset angle (for example, an angle range between 40 degrees and 60 degrees), and with respect to light having an incident angle of the preset angle or greater, the first reflective layer 196 may have a reflectivity that is reduced as the incident angle of the light increases.

For example, the first reflective layer 196 may have a reflectivity of about 90% to about 100% with respect to light having an incident angle that is smaller than the preset angle. In other words, a greater part of light exiting in a direction that is substantially perpendicular to the light emitting layer (for example, the multi quantum wells layer) 194 of the light emitting diode 190 may be reflected by the first reflective layer 196. Also, a greater part of light exiting obliquely at a smaller angle than the preset angle from the direction that is perpendicular to the light emitting surface may be reflected by the first reflective layer 196.

The first reflective layer 196 may have a reflectivity between about 50% and about 80% with respect to light having an incident angle of about 60 degrees. As such, an allowable maximum value of a reflectivity of the first reflective layer 196 between the incident angle of the preset angle and the incident angle of 60 degrees may be reduced from 100% to 80%. Also, an allowable minimum value of a reflectivity of the first reflective layer 196 between the incident angle of the preset angle and the incident angle of 60 degrees may be reduced from 90% to 50%. Accordingly, a reflectivity of the first reflective layer 196 with respect to an incident angle between 40 degrees and 60 degrees may be reduced as the incident angle increases.

The first reflective layer 196 may have a reflectivity that is less than about 80%, with respect to light having an incident angle that is greater than about 60 degrees. For example, an allowable maximum value of a reflectivity of the first reflective layer 196 may be less than 80% with respect to an incident angle that is greater than 60 degrees, and an allowable minimum value of a reflectivity of the first reflective layer 196 may be less than 50% with respect to the incident angle that is greater than 60 degrees. A reflectivity of the first reflective layer 196 with respect to an incident angle that is greater than 60 degrees may be reduced as the incident angle increases.

As such, the first reflective layer 196 may reflect 90% or more of light having an incident angle that is smaller than a preset angle. A reflectivity of the first reflective layer 196 with respect to light having an incident angle that is greater than or equal to the preset angle may be reduced as the incident angle increases. For example, the first reflective layer 196 may reflect about 50% to about 80% of light having an incident angle of about 60 degrees. A reflectivity of the first reflective layer 196 with respect to light having an incident angle that is greater than 60 degrees may be less than 80%.

As described above, the first reflective layers (upper distributed Bragg reflectors) 196 of the red light emitting diode 190R, the green light emitting diode 190G, and the blue light emitting diode 190B may have reflectivities within the same range of reflectivity with respect to an incident angle.

Therefore, the red light emitting diode 190R, the green light emitting diode 190G, and the blue light emitting diode 190B may have similar light profiles.

For this, the first reflective layers (upper distributed Bragg reflectors) 196 of the red light emitting diode 190R, the green light emitting diodes 190G, and the blue light emitting diode 190B may reflect different wavelengths by changing thicknesses of materials applied thereon.

More specifically, as shown in FIGS. 11, 12, and 13, the first reflective layer 196 may be formed by applying materials having different refractive indexes to have various reflectivities according to incident angles.

The first reflective layer (upper distributed Bragg reflector) 196 may reflect light of a certain wavelength incident on the first reflective layer 196 at a certain incident angle by alternately applying a material having a first refractive index n1 and a material having a second refractive index n2, wherein the first refractive index n1 may be different from the second refractive index n2. For example, the first refractive index n1 may be smaller than the second refractive index n2.

For example, the first reflective layer 196 may include a silicon dioxide ($SiO_2$) layer having a refractive index (the first refractive index n1) of 1.457 and a titanium dioxide (TiO2) layer having a refractive index (the second refractive index n2) of 2.493. However, the first reflective layer 196 is not limited to including silicon dioxide ($SiO_2$) and titanium dioxide (TiO2), and may include various materials having different refractive indexes.

In other words, the first reflective layer 196 may be formed by alternately applying a titanium dioxide (TiO2) layer and a silicon dioxide ($SiO_2$) layer.

The first reflective layer (upper distributed Bragg reflector) 196 may reflect light by using constructive interference of light reflected from a boundary between the material having the first refractive index n1 and the material having the second refractive index n2.

A thickness of the material having the first refractive index n1 and a thickness of the material having the second refractive index n2 may be set to cause constructive interference of light reflected from the materials.

In this case, the first reflective layers (upper distributed Bragg reflectors) 196 of the red light emitting diode 190R, the green light emitting diode 190G, and the blue light emitting diode 190B may be formed by changing a thickness of at least one of a silicon dioxide layer or a titanium dioxide layer, such that the first reflective layers 196 have reflectivities within the same range of reflectivity according to an incident angle of light.

For example, as shown in FIGS. 11 and 12, the first reflective layer 196 of the red light emitting diode 190R may include a titanium dioxide layer that is thicker than that of the first reflective layer 196 of the green light emitting diode 190G. More specifically, a maximum thickness $T_{2R\_max}$ of a titanium dioxide layer in the first reflective layer 196 of the red light emitting diode 190R may be greater than a maximum thickness $T_{2G\_max}$ of a titanium dioxide layer in the first reflective layer 196 of the green light emitting diode 190G.

Also, as shown in FIGS. 12 and 13, the first reflective layer 196 of the green light emitting diode 190G may include a titanium dioxide layer that is thicker than that of the first reflective layer 196 of the blue light emitting diode 190B. More specifically, a maximum thickness $T_{2G\_max}$ of the titanium dioxide layer in the first reflective layer 196 of the green light emitting diode 190G may be greater than a maximum thickness $T_{2B\_max}$ of a titanium dioxide layer in the first reflective layer 196 of the blue light emitting diode 190B.

That is, the maximum thickness of the titanium dioxide layer may be greatest in the red light emitting diode 190R, and smallest in the blue light emitting diode 190B. Accordingly, the first reflective layers 196 of the red light emitting diode 190R emitting red light of a longest wavelength and the blue light emitting diode 190G emitting blue light of a shortest wavelength may have reflectivities within the same range of reflectivity according to an incident angle.

Also, according to some embodiments of the disclosure, the first reflective layers 196 of the red light emitting diode 190R, the green light emitting diode 190G, and the blue light emitting diode 190B may have reflectivities within the same range of reflectivity according to an incident angle of light by changing the maximum thicknesses of the silicon dioxide layers or both the maximum thicknesses of the silicon dioxide layers and the maximum thicknesses of the titanium dioxide layers according to the types of the light emitting diodes 190. That is, the first reflective layers 196 of the red light emitting diode 190R, the green light emitting diode 190G, and the blue light emitting diode 190B may have reflectivities within the same range of reflectivity with respect to the same incident angle.

Also, as described above, according to some embodiments of the disclosure, the second reflective layers (lower distributed Bragg reflectors) 197 of the red light emitting diode 190R, the green light emitting diode 190G, and the blue light emitting diode 190B may have the same reflectivity according to an incident angle. That is, the second reflective layers (lower distributed Bragg reflectors) 197 of the red light emitting diode 190R, the green light emitting diode 190G, and the blue light emitting diode 190B may have reflectivities within the same range of reflectivity with respect to the same incident angle.

Thereby, the red light emitting diode 190R, the green light emitting diode 190G, and the blue light emitting diode 190B may have the same or similar light profiles.

For this, the second reflective layers (lower distributed Bragg reflectors) 197 of the red light emitting diode 190R, the green light emitting diode 190G, and the blue light emitting diode 190B may reflect different wavelengths by changing thicknesses of materials applied thereon.

In this case, each second reflective layer 197 may also be formed, like the first reflective layer 196 described above with reference to FIGS. 11 to 13, by applying materials having different refractive indexes to have various reflectivities according to incident angles.

For example, the second reflective layer 197 may be formed by alternately applying a titanium dioxide layer and a silicon dioxide layer.

The second reflective layers (upper distributed Bragg reflectors) 197 of the red light emitting diode 190R, the green light emitting diode 190G, and the blue light emitting diode 190B may be formed by changing a thickness of at least one of a silicon dioxide layer or a titanium dioxide layer, to have reflectivities within the same range of reflectivity according to an incident angle of light.

For example, the second reflective layer 197 of the red light emitting diode 190R may include a titanium dioxide layer that is thicker than that of the second reflective layer 197 of the green light emitting diode 190G. More specifically, a maximum thickness of the titanium dioxide layer in the second reflective layer 197 of the red light emitting diode 190R may be greater than a maximum thickness of the titanium dioxide layer in the second reflective layer 197 of the green light emitting diode 190G.

Also, the second reflective layer 197 of the green light emitting diode 190G may include a titanium dioxide layer that is thicker than that of the second reflective layer 197 of the blue light emitting diode 190B. More specifically, a maximum thickness of the titanium dioxide layer in the second reflective layer 197 of the green light emitting diode 190G may be greater than a maximum thickness of a titanium dioxide layer in the second reflective layer 197 of the blue light emitting diode 190B.

That is, the maximum thickness of the titanium dioxide layer may be greatest in the red light emitting diode 190R, and smallest in the blue light emitting diode 190B. Accordingly, the second reflective layers 197 of the red light emitting diode 190R emitting red light of a longest wavelength and the blue light emitting diode 190B emitting blue light of a shortest wavelength may have reflectivities within the same range of reflectivity according to an incident angle.

Also, according to some embodiments of the disclosure, the second reflective layers 197 of the red light emitting diode 190R, the green light emitting diode 190G, and the blue light emitting diode 190B may have reflectivities within the same range of reflectivity according to an incident angle of light by changing the maximum thicknesses of the silicon dioxide layers or both the maximum thicknesses of the silicon dioxide layers and the maximum thicknesses of the titanium dioxide layers according to the types of the light emitting diodes 190.

So far, an embodiment in which a light emitting diode group 170 of a light source 111 includes a red light emitting diode 190R, a green light emitting diode 190G, and a blue light emitting diode 190R has been described in detail.

Hereinafter, an embodiment in which a light emitting diode group 170 of a light source 111 includes a green light emitting diode 190G and a blue light emitting diode 190B without a red light emitting diode 190R, and the display apparatus 10 includes a red color conversion sheet positioned above the light emitting diode group 170 will be described in detail.

Technical characteristics described above in the embodiment in which the light emitting diode group 170 includes the red light emitting diode 190R, the green light emitting diode 190G, and the blue light emitting diode 190B will be applied in the same way to the following embodiment of the disclosure, except that the following embodiment of the disclosure does not include the red light emitting diode 190R and further includes a red color conversion sheet.

Hereinafter, a difference between the embodiment of the disclosure in which the red light emitting diode 190R is omitted and the red color conversion sheet is further included and the embodiment of the disclosure in which the light emitting diode group 170 includes the red light emitting diode 190R, the green light emitting diode 190G, and the blue light emitting diode 190B will be described.

Figure 14:
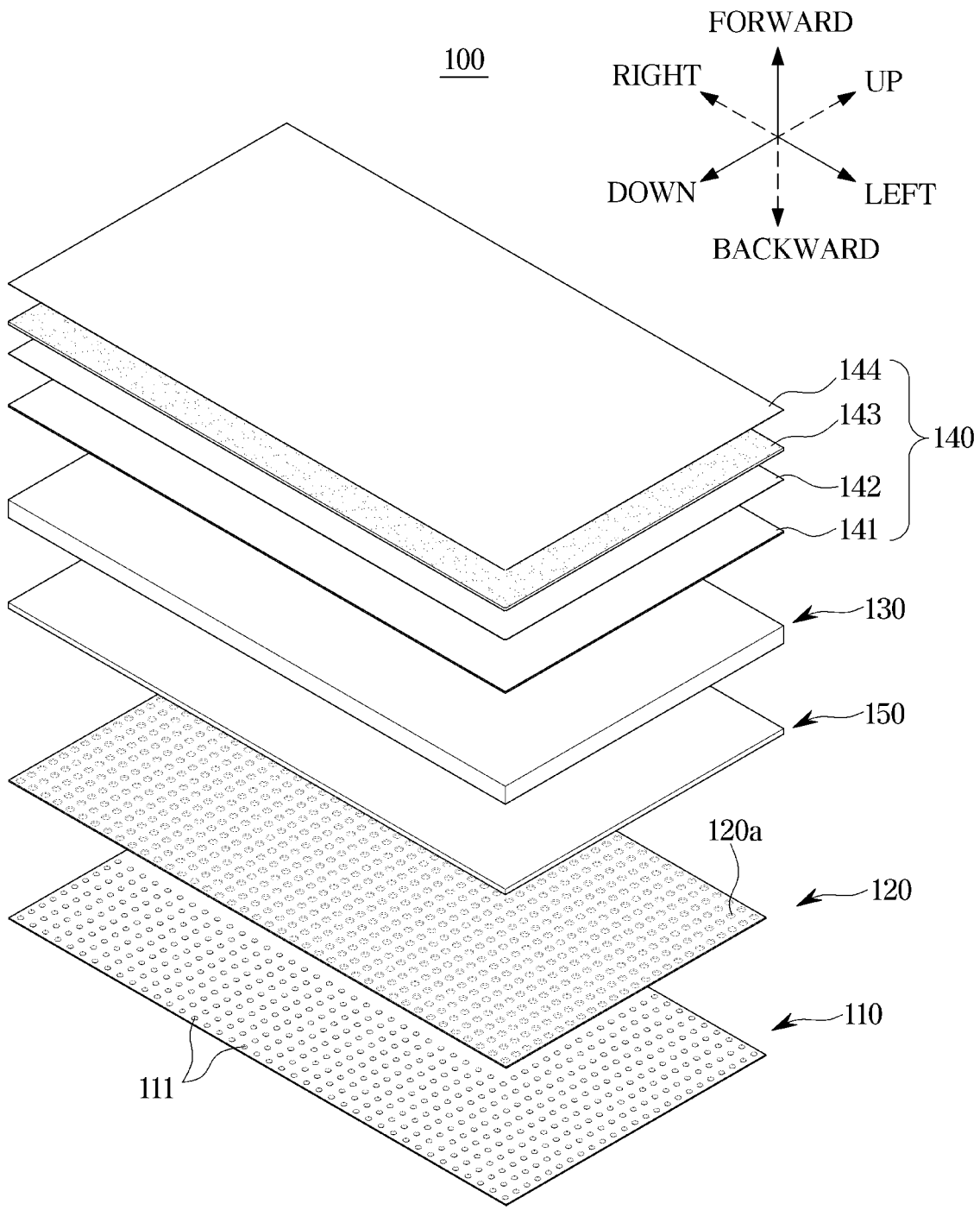
FIG. 14 shows an example of a backlight unit included in a display apparatus according to an embodiment of the disclosure.
Figure 15:
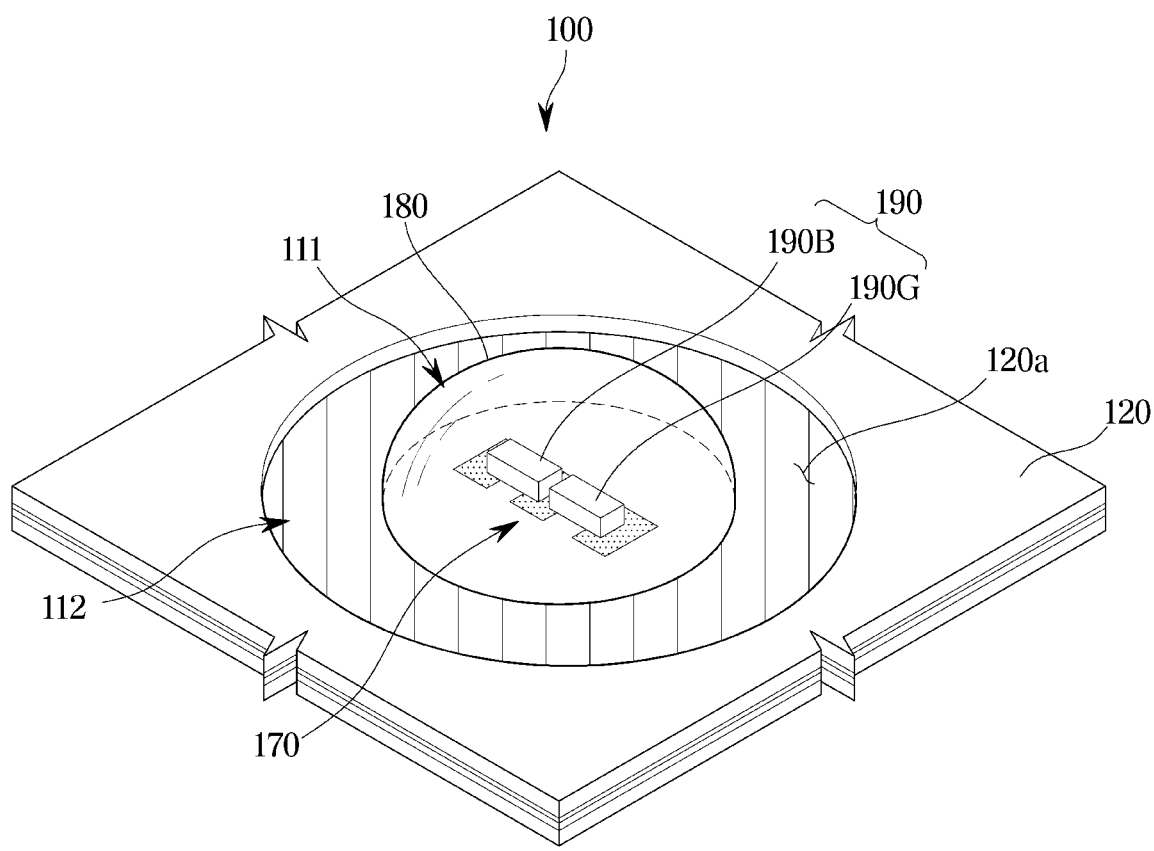
FIG. 15 shows an example of a light source included in a backlight unit according to an embodiment of the disclosure.

FIG. 14 shows an example of the backlight unit 100 included in the display apparatus 10 according to an embodiment of the disclosure, and FIG. 15 shows an example of the light source 111 included in the backlight unit 100 according to an embodiment of the disclosure.

Referring to FIGS. 14 and 15, the display apparatus 10 according to an embodiment of the disclosure may include a red color conversion sheet 150 above the light source module 110. The red color conversion sheet 150 may be a sheet for converting light passing therethrough into a red color.

That is, the red color conversion sheet 150 may be positioned above the plurality of light sources 111 provided in the light source module 110. In other words, the red color conversion sheet 150 may be positioned above the plurality of light emitting diode groups 170.

For example, the red color conversion sheet 150 may be positioned between the reflective sheet 120 and the diffuser plate 130. However, a location of the red color conversion sheet 150 is not limited to the example, and the red color conversion sheet 150 may be positioned between the diffuser plate 130 and the optical sheet 140, inside the optical sheet 140, or on an upper surface of the optical sheet 140.

In this case, a light emitting diode group 170 included in a light source 111 may include only a green light emitting diode 190G and a blue light emitting diode 190B.

Also, the optical dome 180 may cover the light emitting diode group 170. That is, the optical dome 180 may cover the red light emitting diode 190G and the blue light emitting diode 190B included in the light emitting diode group 170.

Green light and blue light emitted from the light emitting diode group 170 may be mixed while passing through the optical dome 180, and the mixed light may pass through the red color conversion sheet 150 to thereby be converted into white light. That is, a part of the mixed light may be converted into red light by passing through the red color conversion sheet 150. In other words, a part of the mixed light may be maintained as green light and blue light after passing through the red color conversion sheet 150, and the other part of the mixed light may be converted into red light by passing through the red color conversion sheet 150. Accordingly, the light passed through the red color conversion sheet 150 may become white light.

As such, the display apparatus 10 according to an embodiment of the disclosure may omit the red light emitting diode 190R that is relatively more expensive than the green light emitting diode 190G and the blue light emitting diode 190B, thereby reducing production cost.

In this case, the distributed Bragg reflectors (the first reflective layers 196 and the second reflective layers 197) of the green light emitting diode 190G and the blue light emitting diode 190B may have reflectivities within the same range of reflectivity according to an incident angle of light.

Also, configurations of the first reflective layer 196 and the second reflective layer 197 may be the same as those of the embodiment of the disclosure in which the light emitting diode group 170 includes the red light emitting diode 190R, the green light emitting diode 190G, and the blue light emitting diode 190B.

The display apparatus according to an embodiment of the disclosure may increase a light diffusing function of the light emitting diodes to achieve product slimness while raising a contrast ratio and color reproduction by configuring the backlight unit with the red light emitting diodes, the green light emitting diodes, and the blue light emitting diodes and causing the distributed Bragg reflectors of the red light emitting diodes, the green light emitting diodes, and the blue light emitting diodes to have reflectivities within the same range of reflectivity according to an incident angle.

While embodiments have been described with reference to the accompanying drawings, it will be apparent that various modifications can be made thereto without changing the technical spirit and essential features of the present disclosure. Thus, it should be understood that the embodiments described above are merely for illustrative purposes and not for limitation purposes in all aspects.

What is claimed is:

1. A display apparatus comprising:
a liquid crystal panel; and
a backlight unit configured to provide light to the liquid crystal panel, the backlight unit comprising:
   a substrate; and
   a plurality of light emitting diode groups provided on an upper surface of the substrate, each of the plurality of light emitting diode groups comprising:
      a red light emitting diode;
      a green light emitting diode; and
      a blue light emitting diode,
   wherein each of the red light emitting diode, the green light emitting diode, and the blue light emitting diode comprises:
      a light emitting layer; and
      a distributed Bragg reflector (DBR) provided on the light emitting layer,
   wherein the red light emitting diode comprises a first light emitting layer configured to emit red light and a first DBR disposed on the first light emitting layer, the green light emitting diode comprises a second light emitting layer configured to emit green light and a second DBR disposed on the second light emitting layer, and the blue light emitting diode comprises a third light emitting layer configured to emit blue light and a third DBR disposed on the third light emitting layer,
   wherein each of the first DBR, the second DBR and the third DBR comprises first layers and second layers that are alternately stacked, the first layers having a first refractive index and the second layers having a second refractive index different from the first refractive index, and
   wherein one of the first layers of the first DBR that has a maximum thickness among the first layers of the first DBR is thicker than one of the first layers of the second DBR that has a maximum thickness among the first layers of the second DBR, and the one of the first layers of the second DBR that has the maximum thickness among the first layers of the second DBR is thicker than one of the first layers of the third DBR that has a maximum thickness among the first layers of the third DBR.

2. The display apparatus of claim 1, wherein reflectivity of each of the first DBR, the second DBR, and the third DBR is reduced as an incident angle of light increases.

3. The display apparatus of claim 2, wherein the reflectivity of each of the first DBR, the second DBR, and the third DBR is constant with respect to light having an incident angle that is smaller than a preset angle, and the reflectivity of each of the first DBR, the second DBR, and the third DBR is reduced, with respect to light having an incident angle that is greater than or equal to the preset angle, as the incident angle of the light increases.

4. The display apparatus of claim 3, wherein the reflectivity of each of the first DBR, the second DBR, and the third DBR is between 90% and 100% with respect to the light having the incident angle that is smaller than the preset angle.

5. The display apparatus of claim 3, wherein the reflectivity of each of the first DBR, the second DBR, and the third DBR is between 50% and 80% with respect to light having an incident angle of 60 degrees that is greater than or equal to the preset angle.

6. The display apparatus of claim 1, wherein the first layers and the second layers comprise titanium dioxide ($TiO_2$) layers and silicon dioxide ($SiO_2$) layers.

7. The display apparatus of claim 6, wherein the first layers are $TiO_2$ layers and the second layers are $SiO_2$ layers.

8. The display apparatus of claim 1, wherein the backlight unit further comprises a plurality of optical domes respectively covering the red light emitting diode, the green light emitting diode, and the blue light emitting diode.

9. The display apparatus of claim 1, wherein the plurality of light emitting diode groups are arranged in a two-dimensional matrix on the upper surface of the substrate.

10. The display apparatus of claim 1, wherein each of the red light emitting diode, the green light emitting diode, and the blue light emitting diode further respectively comprise lower DBRs provided below the light emitting layer, and
reflectivities of the lower DBRs of the red light emitting diode, the green light emitting diode, and the blue light emitting diode are within the same range of reflectivity according to an incident angle of light incident on the lower DBRs.

11. A display apparatus comprising:
a liquid crystal panel; and
a backlight unit configured to supply light to the liquid crystal panel, the backlight unit comprising:
a substrate;
a plurality of light emitting diode groups provided on an upper surface of the substrate, each of the plurality of light emitting diode groups including:
a green light emitting diode; and
a blue light emitting diode; and
a red color conversion sheet provided above the plurality of light emitting diode groups,
wherein each of the green light emitting diode and the blue light emitting diode comprises:
a light emitting layer; and
a distributed Bragg reflector (DBR) positioned on the light emitting layer,
wherein the green light emitting diode comprises a first light emitting layer configured to emit green light and a first DBR disposed on the first light emitting layer, and the blue light emitting diode comprises a second light emitting layer configured to emit blue light and a second DBR disposed on the second light emitting layer,
wherein each of the first DBR and the second DBR comprises first layers and second layers that are alternately stacked, the first layers having a first refractive index and the second layers having a second refractive index different from the first refractive index, and
wherein one of the first layers of the first DBR that has a maximum thickness among the first layers of the first DBR is thicker than one of the first layers of the second DBR that has a maximum thickness among the first layers of the second DBR.

12. The display apparatus of claim 11, wherein a reflectivity of each of the first DBR and the second DBR is reduced as an incident angle of light increases.

13. The display apparatus of claim 12, wherein the reflectivity of each of the first DBR and the second DBR is constant with respect to light having an incident angle that is smaller than a preset angle, and the reflectivity each of the first DBR and the second DBR is reduced, with respect to light of an incident angle that is greater than or equal to the preset angle, as the incident angle of the light increases.

14. The display apparatus of claim 13, wherein the reflectivity of each of the first DBR and the second DBR is between 90% and 100% with respect to the light having the incident angle that is smaller than the preset angle.

15. The display apparatus of claim 13, wherein the reflectivity of each of the first DBR and the second DBR is between 50% and 80% with respect to the light having an incident angle of 60 degrees that is greater than the preset angle.

* * * * *